(12) United States Patent
Norling et al.

(10) Patent No.: US 10,461,732 B1
(45) Date of Patent: Oct. 29, 2019

(54) SYSTEM AND METHOD OF DRIVING A POWER SWITCH IN COMBINATION WITH REGULATED DI/DT AND/OR DV/DT

(71) Applicant: Infineon Technologies Austria AG, Villach (AT)

(72) Inventors: Karl Norling, Villach (AT); Johannes Groeger, Blaubeuren (DE); Alexander Schreiber, Buchheim (DE); Bernhard Wicht, Reutlingen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/011,311

(22) Filed: Jun. 18, 2018

(51) Int. Cl.
*H03K 17/082* (2006.01)

(52) U.S. Cl.
CPC ................................ *H03K 17/0828* (2013.01)

(58) Field of Classification Search
CPC .................................................. H03K 17/0828
USPC ................ 327/108–112, 427, 434, 437, 170, 327/172–176; 326/82, 83, 87
See application file for complete search history.

(56) References Cited

U.S. PATENT DOCUMENTS

| | | | | |
|---|---|---|---|---|
| 5,390,070 A * | 2/1995 | Niedermeier | ...... | H03K 17/0822 323/285 |
| 6,972,611 B1 * | 12/2005 | Thalheim | ............. | H03K 17/168 327/380 |
| 7,046,051 B2 * | 5/2006 | Melbert | ................ | H03K 17/166 327/110 |
| 9,819,339 B2 * | 11/2017 | Ma | ....................... | H03K 17/168 |
| 2008/0204087 A1 * | 8/2008 | Schwarzer | ......... | H03K 17/0828 327/109 |
| 2010/0060326 A1 * | 3/2010 | Palmer | ............. | H03K 17/08148 327/109 |
| 2013/0181750 A1 * | 7/2013 | Lobsiger | .......... | H03K 17/08148 327/109 |
| 2014/0203846 A1 * | 7/2014 | Janschitz | ............. | H03K 17/166 327/109 |

(Continued)

FOREIGN PATENT DOCUMENTS

| EP | 2615737 A1 | 7/2013 |
|---|---|---|
| EP | 2816728 A1 | 12/2014 |

OTHER PUBLICATIONS

Cenusa, Marius et al., "An Improved Method of Controlling IGBT Modules Using an Optimized Gate Current Waveform,"VDE, Verlag GmbH, Germany, ISBN 978-3-8007-3578-5, CIPS 2014, Feb. 25-27, 2014, 6 pages.

(Continued)

*Primary Examiner* — Tomi Skibinski
(74) *Attorney, Agent, or Firm* — Slater Matsil, LLP

(57) ABSTRACT

In accordance with an embodiment, a method of driving a switching transistor includes driving the switching transistor with a gate drive signal; measuring at least one of a derivative of a load path voltage and a derivative of a load path current of the switching transistor; measuring a derivative of the gate drive signal; forming an error signal based on a reference signal, a measured derivative of the gate drive signal, and at least one of the measured derivative of the load path voltage of the switching transistor or the measured derivative of the load path current of the switching transistor; and forming the gate drive signal, where forming the gate drive signal includes processing the error signal using a dynamic controller.

27 Claims, 16 Drawing Sheets

(56) References Cited

U.S. PATENT DOCUMENTS

2014/0375362 A1* 12/2014 Lobsiger ............... H03K 17/00
327/109

OTHER PUBLICATIONS

Fink, Karsten, "Untersuchung neuartiger Konzepte zur geregelten Ansteuerung von IGBTs," Von der Fakultat IV—Elektrotechnik and Unformatik der Technischen Universitat Berlin, Apr. 26, 2010, 224 pages. Abstract Only p. 4.

Heer, Daniel et al., "Simple turn-off description of Trench-Fieldstop IGBT-IGBT 3/3.3kV," 978-3-8007-34-31-3, Infineon Technologies, Germany, https://www.schweitzer-online.de/software/Mesago-PCIM-GmbH/PCIM-Europe-2012/9783800734313/A18786827, May 10, 2012, pp. 938-943.

Idir, Nadir et al., "Active Gate Voltage Control of Turn-on di/dt and Turn-off dv/dt in Insulated Gate Transistors," IEEE Transactions on Power Electronics, vol. 21, No. 4, Jul. 2006, pp. 849-855.

Kuhn, H. et al., "Considerations for a Digital Gate Unit in High Power Applications," IEEE Power Electronics Specialists Conference, Jun. 15-19, 2008, pp. 2784-2790.

Lobsiger, Yanick et al., "Closed-Loop di/dt and dv/dt IGBT Gate Driver," IEEE Transactions on Power Electronics, vol. 30, No. 6, Jun. 2015, pp. 3402-3417.

Palmer, Patrick R., et al., "Active Voltage Control of IGBTs for High Power Applications," IEEE Transactoins on Power Electronics, vol. 19, No. 4, Jul. 2004, pp. 894-901.

Park, Shihong et al., "Flexible dv/dt and di/dt Control Method for Insulated Gate Power Switches," IEEE Transactions on Industry Applications, vol. 39, No. 3, May/Jun. 2003, pp. 657-664.

Schindler, Alexis et al., "EMC and Switching Loss Improvement for Fast Switching Power Stages by di/dt, dv/dt Optimization with 10ns Variable Current Source Gate Driver," Process of the 10th International Workshop on the Electromagnetic Compability of Integrated Circuits (EMC Compo), Nov. 10-13, 2015, pp. 18-23.

Schindler, Alexis et al., "10ns Variable Current Gate Driver with Control Loop for Optimized Gate Current Timing and Level Control for In-Transition Slope Shaping," IEEE Applied Power Electronics Conference and Exposition (APEC), Mar. 26, 30, 2017, pp. 3570-3575.

Shu, Lu et al., "A Voltage Controlled Current Source Gate Device Method for IGBT Devices," IEEE Conversion Congress and Exposition (ECCE) Sep. 14-18, 2014, pp. 5525-5530.

* cited by examiner

SYSTEM AND METHOD OF DRIVING A POWER SWITCH IN COMBINATION WITH REGULATED DI/DT AND/OR DV/DT

TECHNICAL FIELD

The present invention relates generally to a system and method of driving a power switch in combination with regulated di/dt and/or dv/dt.

BACKGROUND

Common driver circuits for power semiconductors such as insulated-gate bipolar transistors (IGBT), metal-oxide-semiconductor field-effect transistors (MOSFET), junction gate field-effect transistors (JFET), and high-electron-mobility transistors (HEMT) may be adapted to control switching slopes of the power semiconductors. Switching slopes are at least one of voltage changes per time (dv/dt) occurring when voltages over load paths of power semiconductors rise or fall and current changes per time (di/dt) occurring when currents through load paths of power semiconductors rise or fall. Commonly, the slopes are not regulated to a certain value or range but are only limited, which may be sufficient for many applications. However, limiting the slopes may mean, for example, limiting dv/dt to a maximum voltage change value or di/dt to a maximum current change value. Limiting di/dt is particularly important with falling currents as an excessive (negative) di/dt in connection with parasitic inductances could generate voltages that may exceed a maximum voltage rating of the respective power semiconductor.

In cases where the signal used to drive the power semiconductor is under closed-loop control, another issue arises with respect to overshoot that may occur when the driving voltage of the power semiconductor is below the turn-on threshold of the semiconductor. In this region of operation, feedback paths that include an output of the respective semiconductor device are essentially disabled and at least portions of the control loop used to regulate the driving voltage of the power semiconductor may operate under open loop conditions. Such open loop behavior may cause voltage errors and overshoot that are corrected by the loop once the loop is fully closed.

SUMMARY

In accordance with an embodiment, a gate drive circuit for controlling a gate-controlled component includes: a dynamic controller configured to receive an input reference signal and to control a gate voltage of the gate-controlled component via an output terminal of the gate drive circuit; at least one component feedback circuit for the dynamic controller, the at least one component feedback circuit configured to provide feedback from at least one of a time derivative of a load path voltage or a time derivative of a load path current of the gate-controlled component to the dynamic controller; and a gate drive feedback circuit for the dynamic controller, the gate drive feedback circuit configured to provide feedback from a time derivative of a voltage at the output terminal of the gate drive circuit.

In accordance with another embodiment, a circuit includes a gate driver circuit having an output coupled to a gate driving terminal, the gate driving terminal configured to be coupled to a gate of a switching transistor; a dynamic controller having an output coupled to an input of the gate driver circuit; a summing circuit having an output coupled to an input of the dynamic controller, and a first input configured to receive a reference signal; at least one feedback circuit coupled between a voltage measurement terminal and a second input of the summing circuit, the at least one feedback circuit configured to provide a signal proportional to at least one of a derivative of a load path voltage of the switching transistor and a derivative of a load path current of the switching transistor to the second input of the summing circuit; and an anti-windup circuit coupled between the output of the gate driver circuit and a third input of the summing circuit, the anti-windup circuit configured to provide a signal proportional to a derivative of an output voltage of the gate driver circuit to the third input of the summing circuit.

In accordance with a further embodiment, a method of driving a switching transistor includes driving the switching transistor with a gate drive signal; measuring at least one of a derivative of a load path voltage and a derivative of a load path current of the switching transistor; measuring a derivative of the gate drive signal; forming an error signal based on a reference signal, a measured derivative of the gate drive signal, and at least one of the measured derivative of the load path voltage of the switching transistor or the measured derivative of the load path current of the switching transistor; and forming the gate drive signal, where forming the gate drive signal includes processing the error signal using a dynamic controller.

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION OF ILLUSTRATIVE EMBODIMENTS

FIG. 1 through FIG. 7 generally describes regulation of the change in voltage (dv/dt regulation) and regulation of the change in current (di/dt regulation) of a power switch as is described in German patent application DE 102016111449.9 filed on Jun. 22, 2016. The detailed description of embodiments of the invention is made with reference to FIG. 8A through FIG. 12B. In embodiments of the present invention, a power switch driver circuit is configured to regulate the derivative of the load path current ($dI_C/dt$), the derivative of the load path voltage ($dV_{CE}/dt$), and the derivative of the gate drive voltage ($dV_{out,Driver}/dt$) using a feedback control circuit. In some embodiments, three feedback paths are used to provide $dI_C/dt$, $dV_{CE}/dt$ and $dV_{out,Driver}/dt$ feedback to a single dynamic controller, such as a proportional-integral, (PI) controller. By providing $dV_{out,Driver}/dt$ in addition to $dI_C/dt$ and $dV_{CE}/dt$, overshoot of the gate drive voltage can be reduced and/or eliminated. This overshoot may also be referred to as the "windup" effect. These embodiments are described with respect to FIGS. 8A-8E, 9A-9B, 10A-10C, 11A-11B and 12A-12B.

In simple common driver circuits, which primarily limit the voltage overshoot during turn-off, feedback signals act directly on the control terminals of semiconductor devices, e.g., their gates. As the feedback signals require a certain amount of current to generate effective changes of the voltages at the gates when acting against low gate resistors (less than 1 Ohm to some Ohms), this direct feedback structure is unfavorable. In other common driver circuits, the feedback currents are lower as they act on the inputs of power amplifier stages that directly drive the gates of the semiconductor devices. The input impedance at the input of the power amplifier stage, at which the feedback current has to generate voltage, is up to several magnitudes higher than the one at the control terminals of the semiconductor device, e.g., the gate resistor. Such driver circuits commonly use discrete transistors connected as current amplifiers, e.g., in an emitter follower type configuration. For high current amplification, two or three amplifier stages may be required, e.g., in a Darlington configuration. To evaluate voltage changes per time dv/dt and/or current changes per time di/dt, standard passive discrete components are commonly employed.

Figure 1:
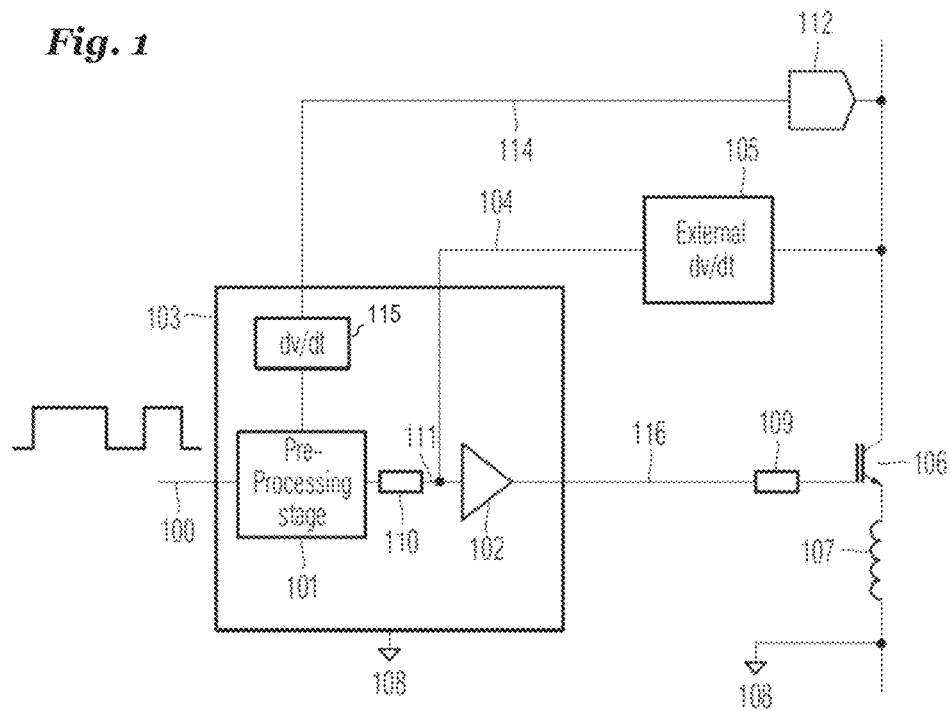
FIG. 1 is a schematic diagram illustrating an exemplary driver circuit without an external output boost circuit and with an integrated circuit having analog and digital dv/dt feedback paths.

FIG. 1 shows an exemplary driver circuit for driving a controllable semiconductor device 106, e.g., an insulated-gate bipolar transistor (IGBT) or any other appropriate semiconductor device. An emitter of semiconductor device 106 may be connected via a parasitic inductance 107 to ground 108 and its collector is connected to a load (not shown). Semiconductor device 106 may also be referred to as a gate-controlled component or a switching transistor. The load path of semiconductor device 106 is the path between its emitter and collector and may include the parasitic inductance 107. The driver circuit receives an external control signal such as a control input signal 100 and includes a signal pre-processing stage 101 and a subsequent signal post-processing stage 102 such as an internal output stage. At least the signal pre-processing stage 101 and the post-processing stage 102 may be integrated in an integrated circuit device 103. The integrated circuit device 103 may receive the control input signal 100 and at least two feedback signals from, e.g., an analog feedback signal 104 from an external analog dv/dt monitoring stage 105 and a digital feedback signal 114 from an external analog-to-digital converter 112 which converts a voltage into binary words forming the digital feedback signal 114. The analog-to-digital converter 112 is connected upstream of an internal dv/dt monitoring stage 115 which is arranged in the integrated circuit device 103.

The feedback signal 104 (e.g., voltage and/or current) may be combined (e.g., summed up) in the integrated circuit device 103 with an internal control signal in (e.g., voltage and/or current) from the internal pre-processing stage 101 at an input of post-processing stage 102. The monitoring stage 105 performs an analog calculation of the voltage changes per time dv/dt from the voltage over the load path of semiconductor device 106, e.g., the voltage at the collector of semiconductor device 106. The monitoring stage 115 performs a digital calculation of the voltage changes per time dv/dt from the digital feedback signal 114 which represents the voltage over the load path of semiconductor device 106. The monitoring stage 115 controls the pre-processing stage 101 which outputs an analog signal (e.g., voltage and/or current) dependent on the input signal 100 and the digital feedback signal 114.

Furthermore, the external dv/dt-monitoring stage 105 and the internal dv/dt-monitoring stage 115 evaluate the voltage changes per time of the voltage over the load path of the semiconductor device 106 to be controlled. Voltage evaluation may include at least one of monitoring a voltage change, gating the feedback signal, detecting rise and fall of the voltage, amplifying or attenuating the at least one feedback signal etc. The output stage 102 provides a control output signal 116, e.g., a controlled voltage and/or current that depend(s) on the control input signal 100 and the feedback signals 104 and 114 to regulate voltage changes dv/dt at the control path (gate) semiconductor device 106.

Optionally, the integrated circuit device 103 may be connected to the gate of semiconductor device 106 via a resistor 109. Also optionally, the signal pre-processing stage 101 and the post-processing stage 102 may be connected via a resistor 110. The resistor 109 may have as little resistance as possible, just enough to damp oscillations in the control path (gate) of the semiconductor device 106 and, thus, stabilize the whole circuit. The currents into the control path (gate) of the semiconductor device 106 are controlled indirectly through feedback into the output stage that forms part of the signal post-processing stage 102 of the integrated circuit device 103 in the present example. The resistor 110 allows feedback currents (forming signal 104) to generate a voltage difference against the voltage provided by pre-processing stage 101, thus regulating the input of output stage of the signal post-processing stage 102 to provide a slope control for semiconductor device 106.

The signal pre-processing stage 101 may perform at least one of level shifting, galvanic isolation, and signal shape processing. The signal post-processing stage 102 is in the present example a voltage-to-voltage amplifier which supplies any current required to achieve the output voltage but may alternatively be a current-to-voltage amplifier as shown, current-to-current amplifier or voltage-to-current amplifier while the circuits upstream and downstream of the respective amplifier are adapted accordingly. The integrated circuit device 103 may be referenced to ground 108, which is one end of the parasitic inductance 107, e.g., the outer end of the parasitic inductance 107. As can be seen, the feedback signals 104 and 114 that represent the voltage change dv/dt act against resistor 110.

Figure 2:
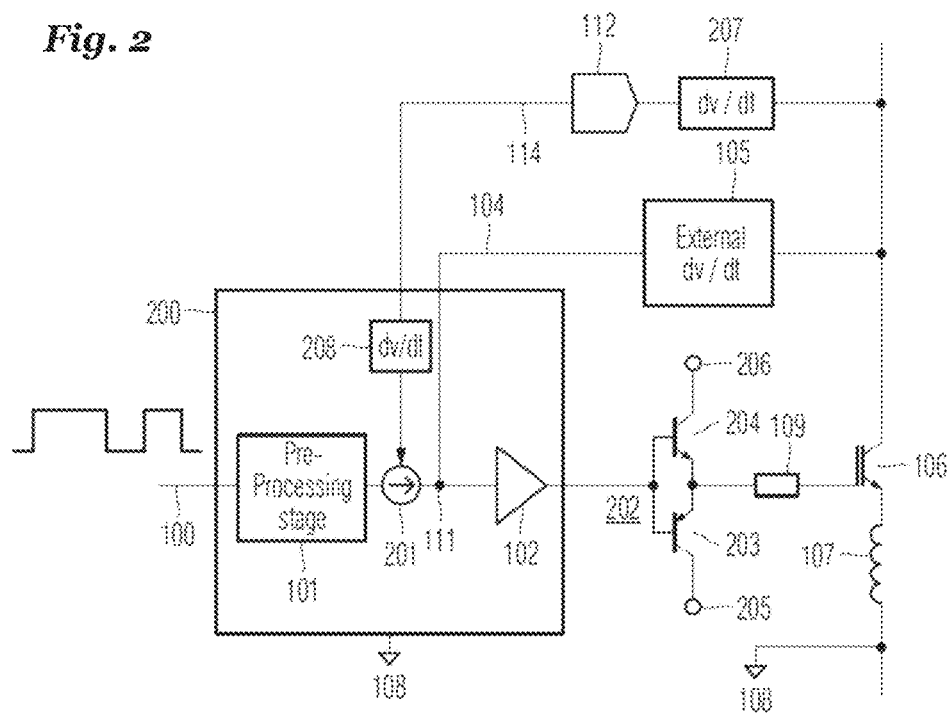
FIG. 2 is schematic diagram illustrating an exemplary driver circuit with an external output boost circuit and with an integrated circuit having analog and digital dv/dt feedback paths.

Referring to FIG. 2, the driver circuit shown in FIG. 1 may be modified in that instead of integrated circuit device 103 an integrated circuit device 200 is used in which resistor no is substituted by a digitally controllable current source 201. As can be seen, the feedback signal 104 (current) acts against current source 201 which provides ideally an infinite DC resistance. The current source 201 is controlled by a digital dv/dt-monitoring stage 208 which digitally evaluates the voltage changes per time of the voltage over the load path of the semiconductor device 106. An analog monitoring stage 207 performs an analog calculation of the voltage changes per time dv/dt from the voltage over the load path of semiconductor device 106. Digital-to-analog converter 112 connected between analog monitoring stage 207 and digital dv/dt-monitoring stage 208 converts the resulting analog dv/dt signal from analog monitoring stage 207 into a digital dv/dt signal for digital dv/dt-monitoring stage 208. The current source 201 may be further adjustable to provide specific currents for different semiconductor devices 106.

Furthermore, an external power amplifier 202 may be inserted between the post-processing stage 102 and the resistor 109. In the present example, the power amplifier 202 includes one amplifier stage formed by a complementary transistor pair (e.g., with pnp bipolar transistor 203 and npn bipolar transistor 204) connected in a complementary emitter follower structure between a negative voltage supply line 205 and a positive voltage supply line 206. For example, the post-processing stage 102 may have a current drive capability of up to 1 or 2 Amperes and the current amplifier 202 may increase the capability by a factor of 10 to 50 so that resistor 109 may be reduced in the circuit shown in FIG. 2. The post-processing stage 102 and/or the current amplifier 202 may alternatively have a class A or class A/B amplifier structure in order to increase the speed with which a hand-over from positive to negative currents is performed. Alternatively or additionally, post-processing stage 102 and/or the power amplifier 202 may have more than one amplifier stage to achieve a very low parasitic driver inductance. Internal dv/dt monitoring stage 115 is substituted by a digital monitoring stage 208 that digitally processes digital input signals and provides digital output signals.

By providing access to the input of the internal output stage of the integrated circuit device the current provided by the feedback stages can be reduced further (to some 10 mA) due to the smaller parasitic capacitances and increased speed and flexibility an integrated circuit can provide. At the same time, it can reduce the number of cascaded external output stages that are needed. An output stage can commonly supply a maximum current of 0.5 A to 2 A or in some cases up to 6 A. Furthermore, the feedback path needs to feed less current so that a smaller feedback capacitor (small extra capacitances on a high voltage switching node) are required, making the whole circuit more efficient in terms of power consumption and size. Amplifying this current by one or more external stages may provide sufficient current to drive very large IGBT devices, power semiconductor modules etc. Alternative to driving the input of the internal power stage by way of a controllable voltage source and a resistor, it may be driven with a controllable current source that can supply positive and negative currents. This allows for a more linear (if the dv/dt feedback capacitance is linear) and load independent regulation of dv/dt (and/or di/dt).

Figure 3:
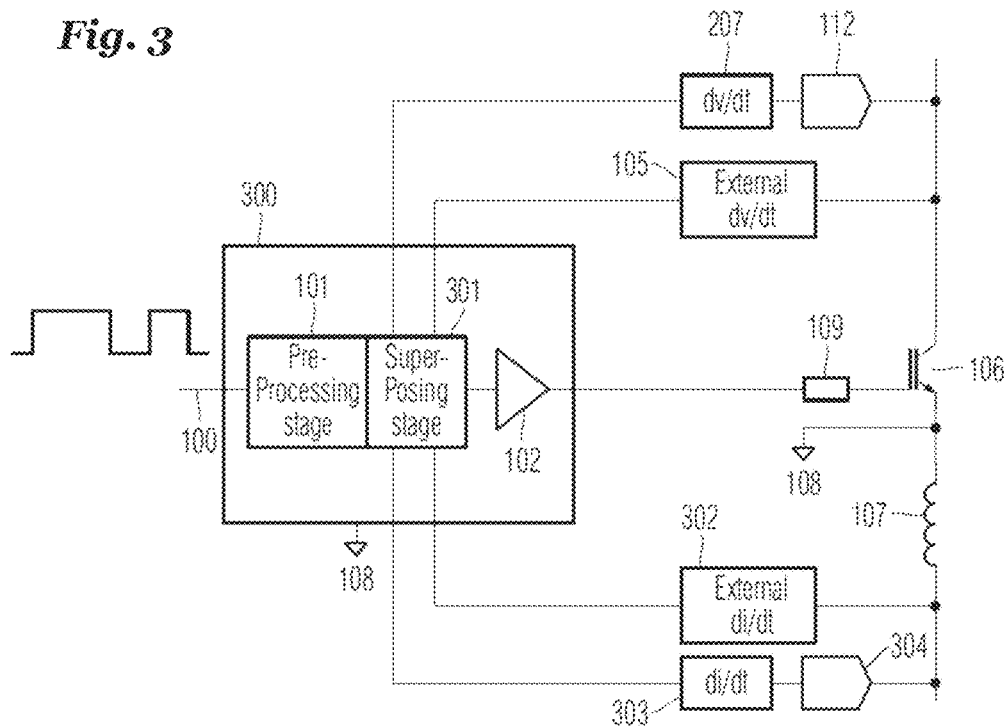
FIG. 3 is schematic diagram illustrating an exemplary driver circuit without an external output boost circuit and with an integrated circuit having analog and digital dv/dt and di/dt feedback paths.

As shown in FIG. 3, the driver circuit shown in FIG. 2 may be modified in that instead of integrated circuit device 200 an integrated circuit device 300 is used in which current source 201 is omitted and a feedback processing and superposing stage 301 is connected between the pre-processing stage 101 and the post-processing stage 102. The digital dv/dt monitoring stage 207 digitally processes digital input signals, e.g., a binary signal representative of the voltage over the load path of semiconductor device 106, and provides a digital output signal, e.g., a binary signal representative of the derivative of the voltage over the load path of semiconductor device 106. Furthermore, at least one other external feedback stage, e.g., an external analog di/dt monitoring stage 302 and/or an external digital di/dt monitoring stage 303, is connected via an analog-to-digital converter 304 to the load path of semiconductor device 106. The feedback processing and superposing stage 301 receives signals from the dv/dt-monitoring stages 105 and 207, signal pre-processing stage 101 and additionally from the analog di/dt monitoring stage 302 and the digital di/dt monitoring stage 303. The digital di/dt monitoring stage 303 digitally processes digital input signals, e.g., a binary signal representative of the current through the load path of semiconductor device 106, and provides a digital output signal, e.g., a binary signal representative of the derivative of the current through the load path of semiconductor device 106.

Figure 4:
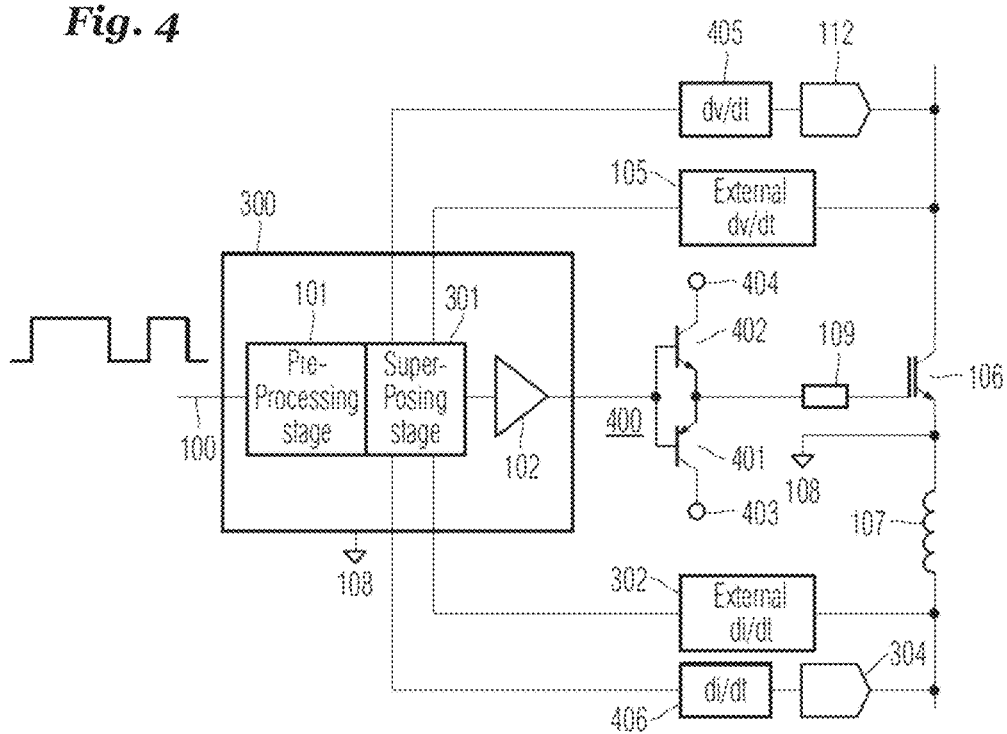
FIG. 4 is schematic diagram illustrating an exemplary driver circuit with an external output boost circuit and with an integrated circuit having analog and digital dv/dt and di/dt feedback paths.

The driver circuit shown in FIG. 3 may be modified as shown in FIG. 4 in that a power amplifier 400 is inserted between the post-processing stage 102 and the resistor 109. In the present example, the power amplifier 400 includes one amplifier stage formed by a complementary transistor pair (e.g., with a PnP bipolar transistor 401 and an npn bipolar transistor 402) connected in a complementary emitter follower structure between a negative voltage supply line 403 and a positive voltage supply line 404. Alternatively, the power amplifier 400 may have more than one amplifier stage to achieve a very low parasitic driver inductance and/or may have a class A or class A/B amplifier structure in order to increase the speed with which a hand-over from positive to negative currents is performed. Furthermore, digital dv/dt-monitoring stage 207 is substituted by a digital dv/dt-monitoring stage 405 and digital di/dt-monitoring stage 303 is substituted by a digital di/dt-monitoring stage 406. The dv/dt-monitoring stage 405 and the di/dt-monitoring stage 406 digitally process digital input signals and provide digital (binary) output signals.

Figure 5:
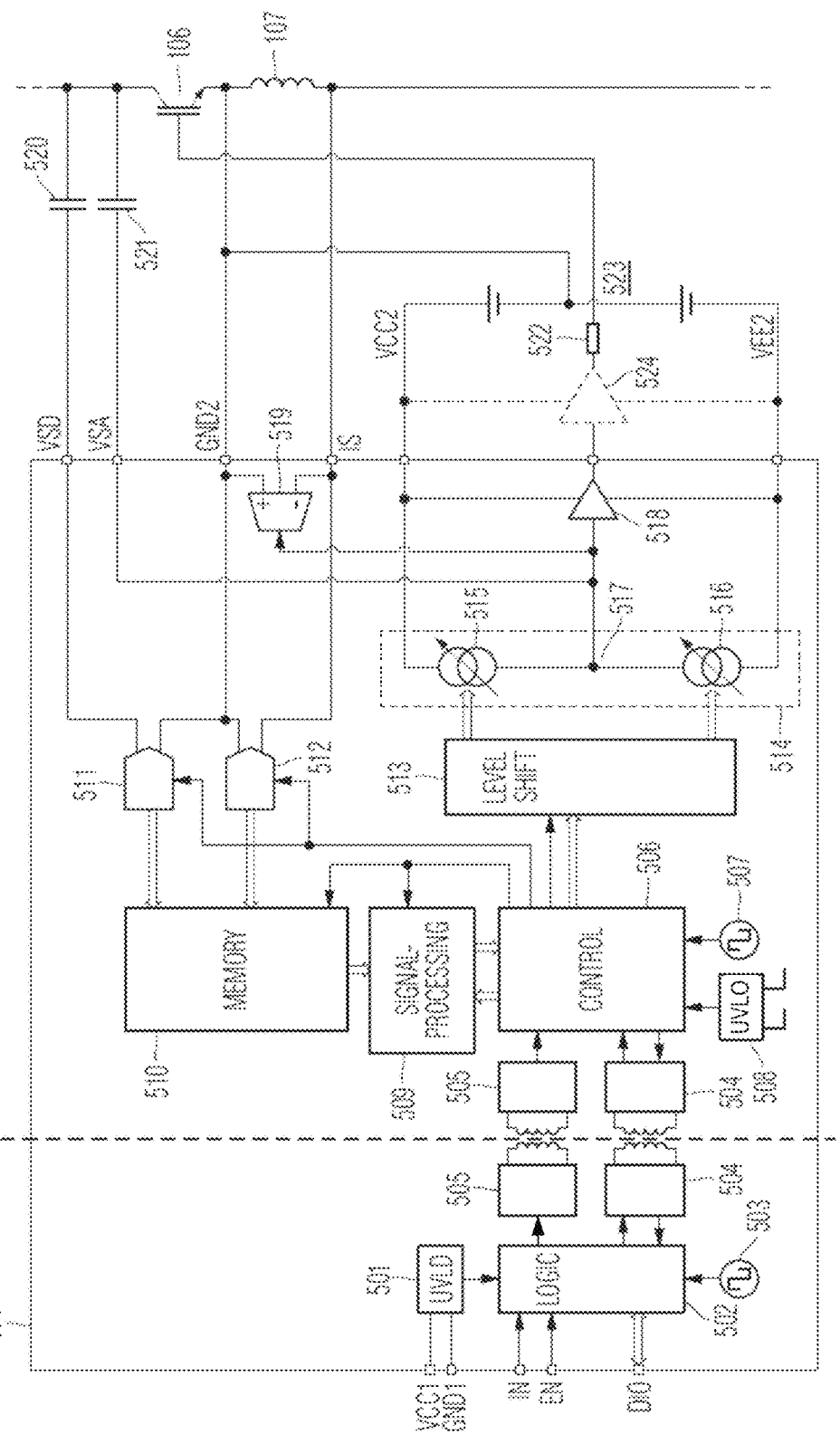
FIG. 5 is a schematic diagram illustrating an exemplary driver circuit with analog and digital feedback paths.

Referring to FIG. 5, another exemplary driver circuit includes an integrated circuit device 500 which has low voltage circuitry part and a higher voltage circuitry part galvanically isolated from the low voltage circuitry part. The low voltage circuitry part includes an under voltage lockout (UVLO) block 501 that receives a (positive) supply voltage VCC1 of the integrated circuit device 500 and first ground GND1 to which the integrated circuit device 500 is referred to. The under voltage lockout block 501 is an electronic circuit block used to disable and/or turn off the power for the integrated circuit device 500 in the event of the supply voltage VCC1 dropping below an operational value. For example, in the integrated circuit device 500, the under voltage lockout block 501 may monitor the supply voltage VCC1 and turn off the circuit if the supply voltage VCC1 drops below a specific threshold, thus protecting the integrated circuit device 500 and, as the case may be, also a semiconductor device and/or a load associated with the integrated circuit device 500. The low voltage circuitry part of the integrated circuit device 500 may further include a logic block 502 which receives an input (control) signal IN, e.g., for switch control, and an enable signal EN, e.g., for enabling or disabling, e.g., the logic block 502, the integrated circuit device 500 or the whole driver circuit.

The logic block 502 may also provide a digital input/output interface for exchanging digital data DIO such as specific control data, status data, service data etc. with other units (not shown). Furthermore, the logic block 502 may be clocked with a clock signal provided by a clock signal generator 503 and may be connected to a galvanically isolating bidirectional signal coupler 504, which may provide the isolation on an inductive (as shown), capacitive, optical or any other appropriate basis. Optionally, another signal coupler 505, e.g., a unidirectional coupler, may couple in terms of signals but galvanically isolate the low voltage circuitry part and the higher voltage circuitry part.

In the higher voltage circuitry part, the signal coupler 504 and, if present, the signal coupler 505 are connected to a control block 506, which may be a logic block or a software block in a processor implementation or a combination of both. The control block 506 receives a clock signal from a clock signal generator 507 and a signal from an under voltage lockout block 508 for the higher voltage circuitry part. The control block 506 exchanges digital data with a central signal processing block 509 which may provide for load path voltage/current slope post processing, regulation and adaptation. For example, the central signal processing block 509 may be adapted or programmed to realize a digital loop controller comprising a least one of a proportional control mechanism (P), integral control mechanism (I), derivative control mechanism (D) or combinations thereof such as, e.g., a PI or PID control mechanism. Furthermore, the control block 506 sends an on/off signal to the central signal processing block 509 and a memory 510, a sampling control signal to two analog-to-digital conversion blocks 511 and 512, and another on/off signal as well as slope shape data to a level shifting block 513. The analog-to-digital conversion blocks 511 and 512 send data to the memory 510. Analog-to-digital conversion block 511 receives a voltage sense signal VSD (e.g., a voltage or current) referred to a second ground GND2 and analog-to-digital conversion block 512 receives a current sense signal IS (e.g., a voltage or current) referred to a second ground GND2.

The level shifting block 513 sends control data to an adaptive driver block 514, which may include two digitally controllable current sources 515 and 516 connected in series between a (negative) supply voltage VEE2 and a (positive) supply voltage VCC2 with a node 517 between the two current sources 515 and 516. At least one of the supply voltages VEE2 and VCC2 may be monitored by the under voltage lockout block 508. The current sources 515 and 516 are each controlled by digital data provided by the level shifting block 513. A driver output stage 518 is connected to the node 517, to a line that carries a voltage sense signal (e.g., a voltage or current) and to the output of a transconductance amplifier block 519 whose non-inverting input is connected to the second ground GND2 and whose inverting input is connected to a line that receives a current sense signal IS (e.g., a voltage over an inductance corresponding to a change in current to be measured).

The external wiring of the integrated circuit device 500 includes two capacitors 520 and 521 which couple the collector line of semiconductor device 106 with the line carrying the voltage sense signal VSD and the line carrying the voltage sense signal VSA, respectively. The two capacitors 520 and 521 are used to obtain dv/dt from the voltage over the load path. The second ground GND2 is established by a node between the emitter of semiconductor device 106 and one end of the parasitic inductance 107. The current sense signal IS is picked up at the other end of the parasitic inductance 107. The inductance 107 is used to differentiate the current through the load path to obtain di/dt and to transform the current into a corresponding voltage to be measured. The gate of semiconductor device 106 is connected via a resistor 522 to the output stage 518. The supply voltages VEE2 and VCC2 may be provided by a bipolar voltage source 523 whose ground is connected to the second ground GND2. Optionally, a power amplifier 524, which may also be supplied with supply voltages VEE2 and VCC2, is connected between the output stage 518 and the resistor 522. In the exemplary driver circuit shown in FIG. 5, blocks 501-509, 513 may form a pre-processing stage, blocks 510-512, 519 a feedback processing and superposing stage, and blocks 515-518 a signal post-processing stage.

By adding external feedback capacitance (e.g., capacitors 520 and 521) and providing a power stage (e.g., output stage 518) that buffers the current source driver (e.g., driver block 514), dv/dt feedback and/or di/dt feedback require a much lower peak current on the current source driver. In this way, the current source driver can be designed with lower power elements allowing the current source to be more accurate and faster in changing its current value. Additionally, the current source driver can be built as current-output digital-to-analog converter that can be programmed digitally in order to change dv/dt and/or di/dt. An additional outer digital cycle regulation loop may be added to further control the dv/dt and/or di/dt as shown in FIG. 5. The programming of dv/dt and di/dt can be changed independently without changing the dv/dt or di/dt analog feedback networks. The digital loop may track changes of the load path voltage and load path current in order to change the digital-to-analog converter output current at the correct time when a hand-over occurs between dv/dt and di/dt. In general, the analog feedback path is faster (smaller delay times caused by signal processing and/or a higher critical frequency) but offers a lower accuracy and flexibility. In contrast, the digital feedback path is slower (greater delay times caused by signal processing and/or a lower critical frequency) but offers higher accuracy and flexibility.

The driver circuit shown in FIG. 5 is an example of how an integrated driver with high voltage level-shifting as well as analog and digital dv/dt and di/dt feedback paths may be implemented. The di/dt feedback path (e.g., corresponding to signal IS) senses the voltage at the emitter inductance (e.g., parasitic inductance 107), injecting/sinking a corresponding (e.g., proportional) current into/from a summing node (e.g., node 517) of a reference current originating from a current source pre-driver stage (e.g., transconductance amplifier block 519) and the dv/dt analog-feedback capacitor (e.g., capacitor 521). The summing node controls the input of a unity gain amplifier (one internal stage such as output stage 518 only or in combination with an external cascaded stage such as current amplifier 524) that, in turn, drives the gate voltage of the external semiconductor device (e.g., semiconductor device 106). The dv/dt digital-feedback path may be implemented by way of an analog-to-digital converter (e.g., analog-to-digital converter block 511) that samples the current flowing through the dv/dt digital-feedback capacitor (e.g., capacitor 520). The di/dt digital-feedback path is implemented by way of an analog-to-digital converter (e.g., analog-to-digital converter block 512) that samples a voltage change over the emitter inductance (e.g., parasitic inductance 107) representative of a current change through the emitter inductance.

Figure 6:
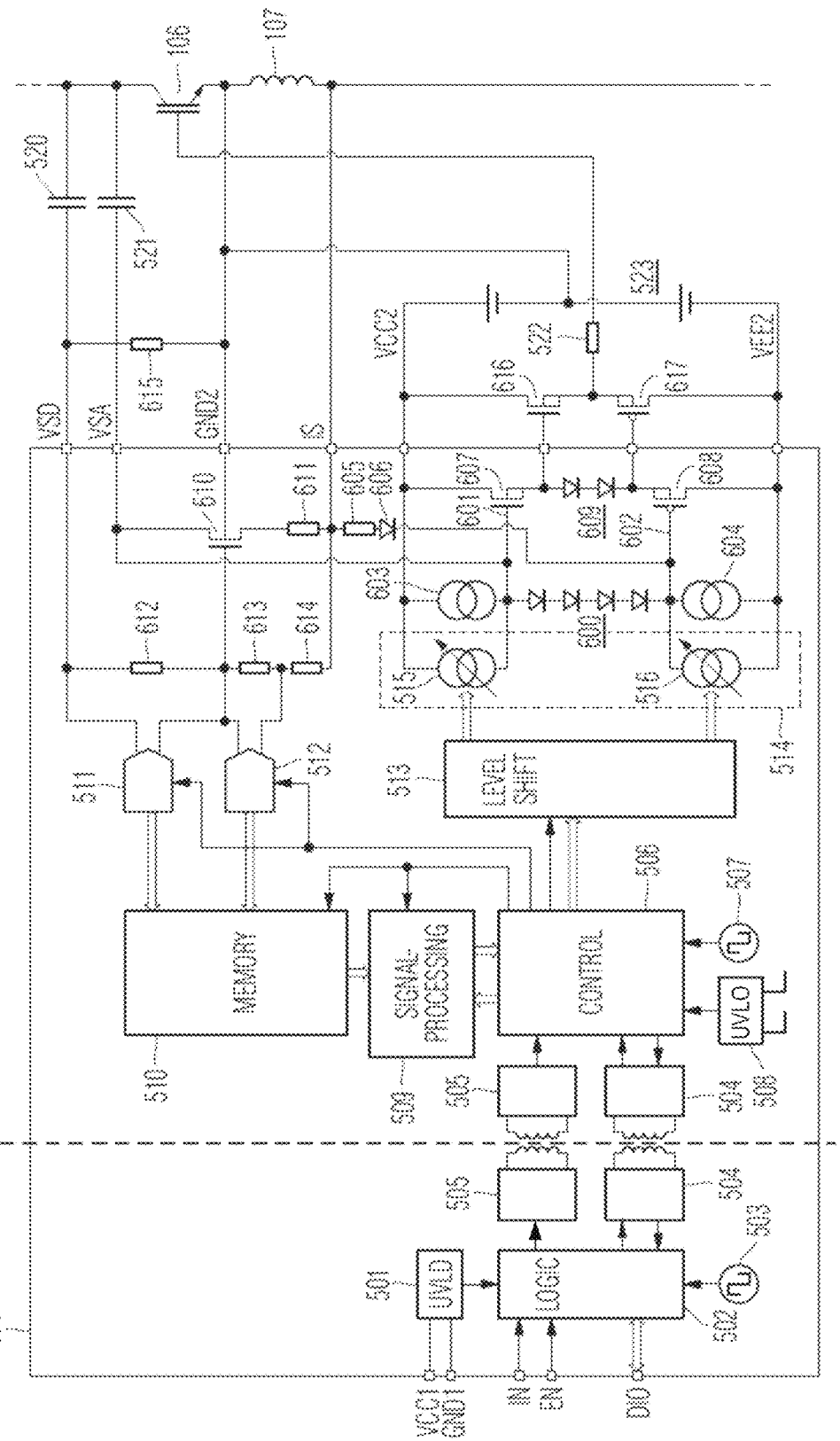
FIG. 6 is schematic diagram illustrating an exemplary driver circuit with modified analog and digital feedback paths.

FIG. 6 shows the driver circuit described above in connection with FIG. 5 with some modifications and alternative implementations. The two digitally controllable current sources 515 and 516 are connected with each other through a diode series connection 600 of one or more diodes (e.g., four diodes), thereby forming a node 601 between current source 515 and one end of diode series connection 600, and a node 602 between current source 516 and the other end of diode series connection 600. Each digitally controllable current source 515, 516 is connected in parallel with a constant current source 603 and 604, respectively. The line carrying the voltage sense signal VSA is connected to node 601 and the line carrying the current sense signal IS is connected through a resistor 605 and a diode 606 (instead of transconductance amplifier block 519) to node 602.

The output stage 518 shown in FIG. 5 is substituted by a class A/B amplifier stage including a metal-oxide-semiconductor field-effect transistor (MOSFET) 607 of the n-channel type whose gate is connected to the node 601 and whose drain is connected to the supply voltage VCC2, and including a metal-oxide-semiconductor field-effect transistor 608 of the p-channel type whose gate is connected to the node 602 and whose drain is connected to the supply voltage VEE2. The sources of transistors 607 and 608 are connected with each other via another diode series connection 609 with at least one diode (e.g., two diodes). Furthermore, a metal-oxide-semiconductor field-effect transistor 610 of the n-channel type is connected via its gate to second ground GND2 and via its drain to the line carrying the voltage sense signal VSA. The source of transistor 610 is connected through a linearization resistor 611 to the line carrying the current sense signal IS. Furthermore, a resistor 612 may be connected between the line carrying the voltage sense signal VSD and the second ground GND2, and a voltage divider including two resistors 613 and 614 connected in series is connected between the second ground GND2 and the line carrying the current sense signal IS to reduce the voltage swing at the respective analog-to-digital converter input if required.

The input of analog-to-digital converter block 512 is now connected to a node between resistors 613 and 614 (instead of being connected directly to the line carrying the current sense signal IS). Optionally, an external resistor 615 may be connected in parallel to resistor 612. The current amplifier 524 may be realized in the present example by way of a metal-oxide-semiconductor field-effect transistor (MOSFET) 616 of the n-channel type whose gate is connected to the source of transistor 607 and whose drain is connected to the supply voltage VCC2, and by way of a metal-oxide-semiconductor field-effect transistor 617 of the p-channel type whose gate is connected to the source of transistor 608 and whose drain is connected to the supply voltage VEE2. The sources of transistors 607 and 608 are connected with each other and resistor 522.

In the driver circuit of FIG. 6, the unity gain buffer stage (output stage 518 in FIG. 5) is replaced by two cascaded Class-A/B amplifier stages (transistors 607, 608, 616, 617 and diode series connection 609 in FIG. 6) and two bias current sources (constant current sources 603 and 604 in FIG. 6). The analog dv/dt feedback path stays the same. The analog di/dt feedback path is replaced by two separate feedback paths for turn-on (transistor 610 and resistor 611) and turn-off (resistor 605 and diode 606 in FIG. 6).

Figure 7:
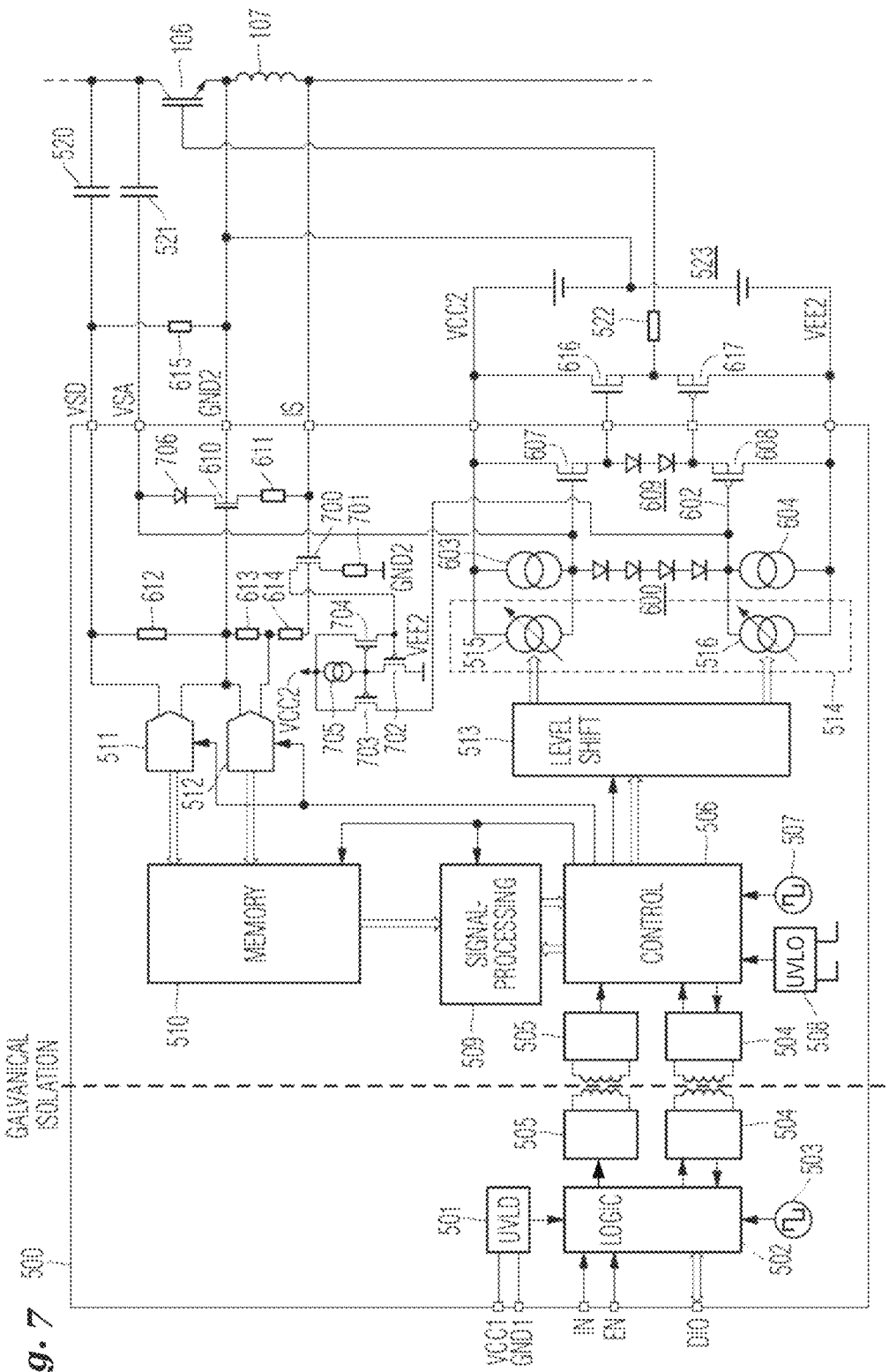
FIG. 7 is schematic diagram illustrating an exemplary drive circuit with still further modified analog and digital feedback paths.

In the driver circuit discussed above in connection with FIG. 6, resistor 605 and diode 606 may be substituted by a metal-oxide-semiconductor field-effect transistor 700 of the n-channel type, a resistor 704 metal-oxide-semiconductor field-effect transistors 702-704 of the p-channel type and a current source 705. As shown in FIG. 7, transistor 700 may be connected via its gate to the line carrying the current sense signal IS and via its source and through the linearizing resistor 701 to the second ground GND2 providing a voltage-to-current conversion. The transistor 702 is connected via its drain to the supply voltage line VEE2, via its gate to the drains of transistors 700 and 704, and via its source to the gates of transistors 703 and 704. A current source 705 is connected between the supply voltage line VCC2 and the gates of transistors 703 and 704. The sources of transistors 703 and 704 are also connected to the supply voltage line VCC2. The drain of transistor 703 is connected to the node 602. Transistors 702-704 in connection with current source 705 form a current mirror circuit which reverses the turn-off di/dt feedback current from transistor 700. The speed of the current mirror with transistors 703 and 704 is boosted by the addition of transistor 702 which acts as a source follower. In order to speed up the current mirror in both directions, current source 705 has been added. Furthermore, a diode 706 is inserted between the line carrying the voltage sense signal VSA and the drain of transistor 610.

The driver circuit shown in FIG. 7 allows also for operations when the ground GND2 and the supply voltage VEE2 are not the same so that also bipolar power supplies can be employed to supply the gate driver. Furthermore, the turn-off di/dt feedback does not directly feed a current into the summing node through a resistor that makes the feedback load dependent e.g., on the load condition of the semiconductor device 106 and/or its Miller plateau. For example, if the voltage change dv/dt is fed back directly from the collector of the semiconductor device 106 through a capacitor (capacitor 520) to the summing node, the feedback current through the feedback capacitor (capacitor 520) would be dependent on the voltage change dv/dt at the collector of the semiconductor device 106 when the gate voltage of the semiconductor device 106 is at the Miller plateau. However, the current change di/dt, if it is directly fed back through a resistor (e.g., resistor 605 in FIG. 6), would become dependent on the voltage difference between the di/dt induced voltage of the inductance (parasitic inductance 107) and the actual voltage level of the gate of the semiconductor device 106 (or input of a buffer stage).

In the driver circuit shown in FIG. 7, the semiconductor device 106 is driven with a bipolar power supply and a load independent di/dt feedback. For turn-on di/dt, a simple diode (diode 706) is set at reversed bias when the summing node (including gate of transistor 607) is pulled below second ground GND2. The transistor 610 connected as a source follower over resistor 611 automatically creates a handover from positive to negative current regulation. The current summing node (including gate of transistor 607), with dV/dt through capacitor 521 and di/dt over inductance 107, automatically hands over from dV/dt to di/dt regulation. To make the feedback at turn-off independent from the load, the transconductance amplifier may be configured to measure the voltage differentially over the parasitic inductance 107 and then to inject a high side current into the summing node 602 that is independent from the summing node voltage. A similar concept as for the turn-on voltage change di/dt feedback may be implemented to generate a current proportional to the voltage across parasitic inductance 107 when semiconductor device 106 turns off. However, this current has the wrong polarity. In order to obtain the correct polarity of the current, a high side current mirror is employed (transistors 703 and 704). Transistor 702 and the current source 705 are used to achieve the necessary bandwidth in the current mirror. The approaches outlined above can also be implemented with discrete devices but control of speed and control of parasitic elements may be more favorable when realized in an integrated circuit.

In the examples described above in connection with FIGS. 1-7, the analog feedback stages and digital feedback stages comprise signal delay times due to their respective signal processing. The signal delay time of the digital feedback stages may be greater than the delay time of the corresponding analog feedback stages. However, the accuracy of the digital feedback stages may be greater than that of the corresponding analog feedback stages. Furthermore, digital feedback stages or paths may not only include digital circuitry but also analog and digital (mixed) circuitry.

Figure 8A:
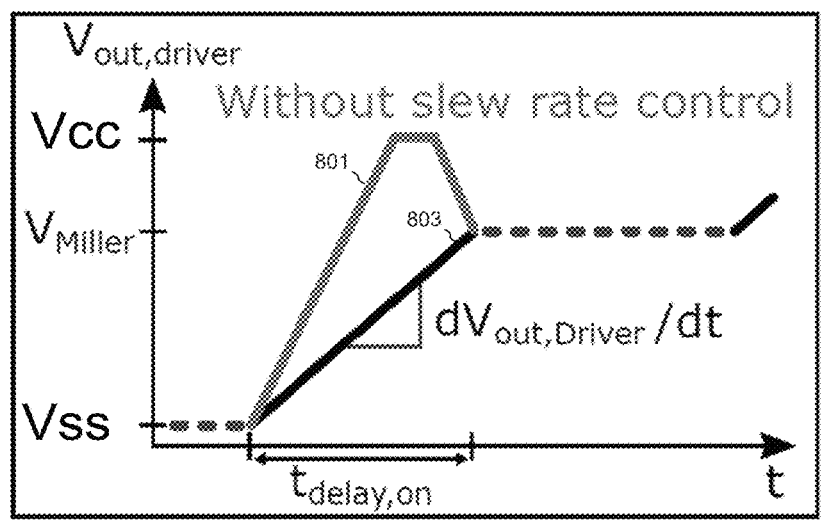
FIGS. 8A-8E illustrate graphs and waveform diagrams that depict the performance of embodiment gate drive systems that provide closed-loop slew rate control of the output voltage of a gate driver circuit.

In some cases, embodiment driver circuits may be prone to voltage overshoot when the gate driver is turned-on or turned-off, as is illustrated in the waveform diagram of FIG. 8A. Trace 801 shown in the waveform diagram of FIG. 8A represents the output voltage $V_{out,driver}$ of an embodiment gate driver circuit that is used to provide a driver voltage, for example, the gate of semiconductor device 106. As shown, when the driver is activated, output voltage $V_{out,driver}$ rises from a minimum voltage of Vss to a maximum voltage Vcc during a first portion of time period $t_{delay,on}$. Eventually, driver output voltage $V_{out,driver}$ decreases to the Miller plateau voltage $V_{Miller}$ after the control loop of the embodiment driver circuit has had a chance to respond. The reason why output voltage $V_{out,driver}$ initially overshoots is because semiconductor device 106 is off during the initial portion of time period $t_{delay,on}$. Because semiconductor device 106 is off, no $dV_{CE}/dt$ and $dI_C/dt$ feedback is provided during this time and the driver output voltage $V_{out,driver}$ essentially increases in an unregulated manner until semiconductor device 106 turns on and the $dV_{CE}/dt$ and $dI_C/dt$ feedback loops are closed. During the initial delay phase, the feedback signals of both $dV_{CE}/dt$ and $dI_C/dt$ are zero, while the non-zero reference signal is already applied. The controller winds-up hard to achieve a non-zero $dI_C/dt$ according to the non-zero reference. Due to the wind-up, the output of the gate driver may be limited to the driver supply voltage (labeled here as Vcc). When the gate voltage reaches its threshold and the current through the switch starts to rise (effecting a positive $dI_C/dt$ feedback signal), the output of the driver needs to settle from the driver supply to the steady-state value for $dI_C/dt$, which therefore takes a longer delay time. During this time, $dI_C/dt$ is not regulated. This voltage overshoot phenomenon is also referred to herein as "wind-up" or the "wind-up effect."

In some situations, the controller might wind-up or overshoot in a manner that makes it difficult or impossible for the controller to settle the driver output voltage $V_{out,driver}$ and or provide the requisite $dV_{CE}/dt$ and $dI_C/dt$. In extreme situations, driver output voltage $V_{out,driver}$ may remain unsettled for the entirety of the switching cycle.

In some conventional systems, the windup effect is mitigated by monitoring and controlling the gate current provided to the gate of the switching device. In such systems the gate current is monitored by measuring the voltage across a current sense resistor coupled in series with the gate of the switching device. Such systems may require extra pins in order to support monitoring the voltage across the current sense resistor. In addition, the gate drive current for such systems may need to be recalibrated for different size switching devices.

In embodiments of the present invention, the wind-up effect is mitigated and/or eliminated by controlling the slew rate of the driver output voltage ($dV_{out,Driver}/dt$) during the turn-on and/or turn-off switching delay phases. The effect of this controlled slew rate control is represented by trace 803 in the waveform diagram of FIG. 8A which represents the driver output voltage $V_{out,Driver}$ when the slew rate of the output driver is under feedback control. As can be seen in FIG. 8A, the slew rate of the driver output voltage $dV_{out,Driver}/dt$ can be controlled in such a way that the driver output voltage $V_{out,driver}$ smoothly approaches the Miller plateau $V_{Miller}$ without overshooting. It should be understood, however, that the waveform diagram of FIG. 8A is a simple illustration of a single scenario. In some embodiments of the present invention, there might be a slight overshoot present depending on the environment and configuration of the particular system. Using the proposed $dV_{out,Driver}/dt$ control, differences in gate voltage and gate current can be kept small, which reduces the settling time of the gate voltage. Consequently, the $dI_C/dt$ at turn-on or the $dV_{CE}/dt$ at turn-off can reach its steady state value earlier.

Advantages of embodiment gate driver systems and methods include the ability to mitigate the "windup" effect in a power and space efficient manner. In some embodiments, the windup effect can be mitigated without the need for additional external pins to support monitoring a current sense resistor and/or without the need to recalibrate the system for different sized switching devices.

During operation, when the gate voltage settles to Miller plateau voltage $V_{Miller}$ using embodiment slew rate control methods, the $dI_C/dt$ and $dV_{CE}/dt$ control loops become active. At this time, the embodiment $dV_{out,Driver}/dt$ feedback path may be deactivated in order to ensure that the amplifier output slew rate ($dV_{out,driver}/dt$) is no longer limited and is able to settle quickly. This deactivation may be achieved, for example, by electrically disconnecting the feedback path from the controller. Alternatively, the $dV_{out,Driver}/dt$ feedback path may remain active, for example, in situations where the magnitude of the outputs of the $dI_C/dt$ and $dV_{CE}/dt$ feedback paths exceed the output of the $dV_{out,Driver}/dt$ feedback path. In some embodiments, the $dV_{out,Driver}/dt$ feedback path may be configured to only provide feedback in a single direction. For example, feedback may be provided for positive slopes of $V_{out,Driver}$, but not provided for negative slopes of $V_{out,Driver}$ and vice versa.

Figure 8B:
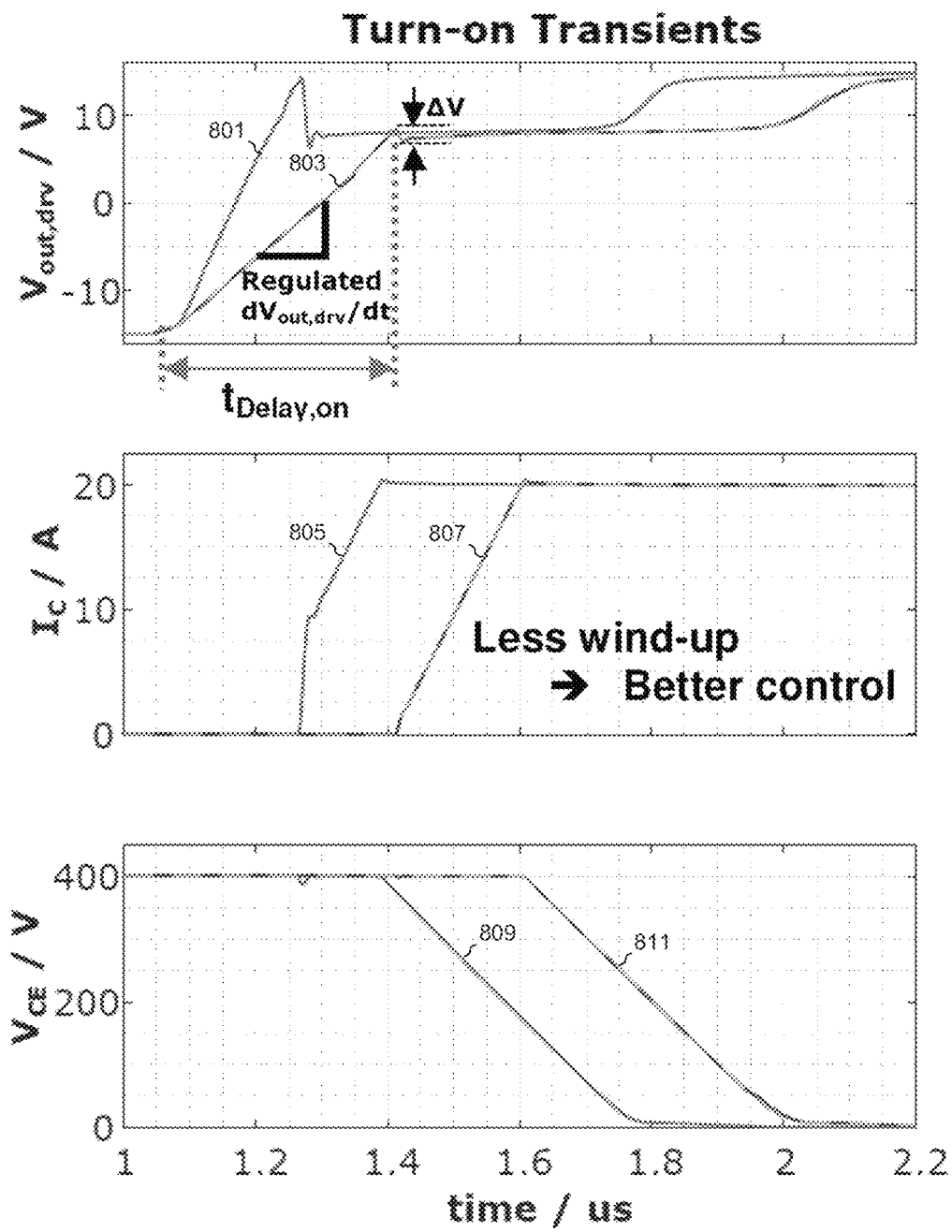

FIG. 8B includes waveform diagrams showing a comparison of turn-on behavior using embodiment $dV_{out,Driver}/dt$ slew rate control methods with respect to exemplary examples that do not utilize embodiment slew rate control methods. For example, trace 801 represents the gate driver output voltage for the exemplary example, while trace 803 illustrates the gate driver output voltage for the embodiments that utilize embodiment $dV_{out,Driver}/dt$ slew rate control methods. As can be seen, the amount of overshoot $\Delta V$ for the gate driver that utilizes embodiment $dV_{out,Driver}/dt$ slew rate control methods is significantly less than the example embodiments.

Trace 8o5 represents the collector current $I_C$ of semiconductor device 106 for an exemplary example that does not utilize embodiment $dV_{out,Driver}/dt$ slew rate control methods, while trace 807 represents the collector current $I_C$ for an embodiment that utilizes embodiment slew rate control methods. As can be seen, trace 807 exhibits less windup than trace 805, thus, systems that utilize embodiment slew rate control methods may be easier to control. Trace 809 represents the collector-emitter voltage $V_{CE}$ of semiconductor device 106 for an exemplary example that does not utilize embodiment slew rate control methods, and trace 811 represents the collector current $I_C$ for an embodiment that utilizes embodiment slew rate control methods.

Figure 8C:
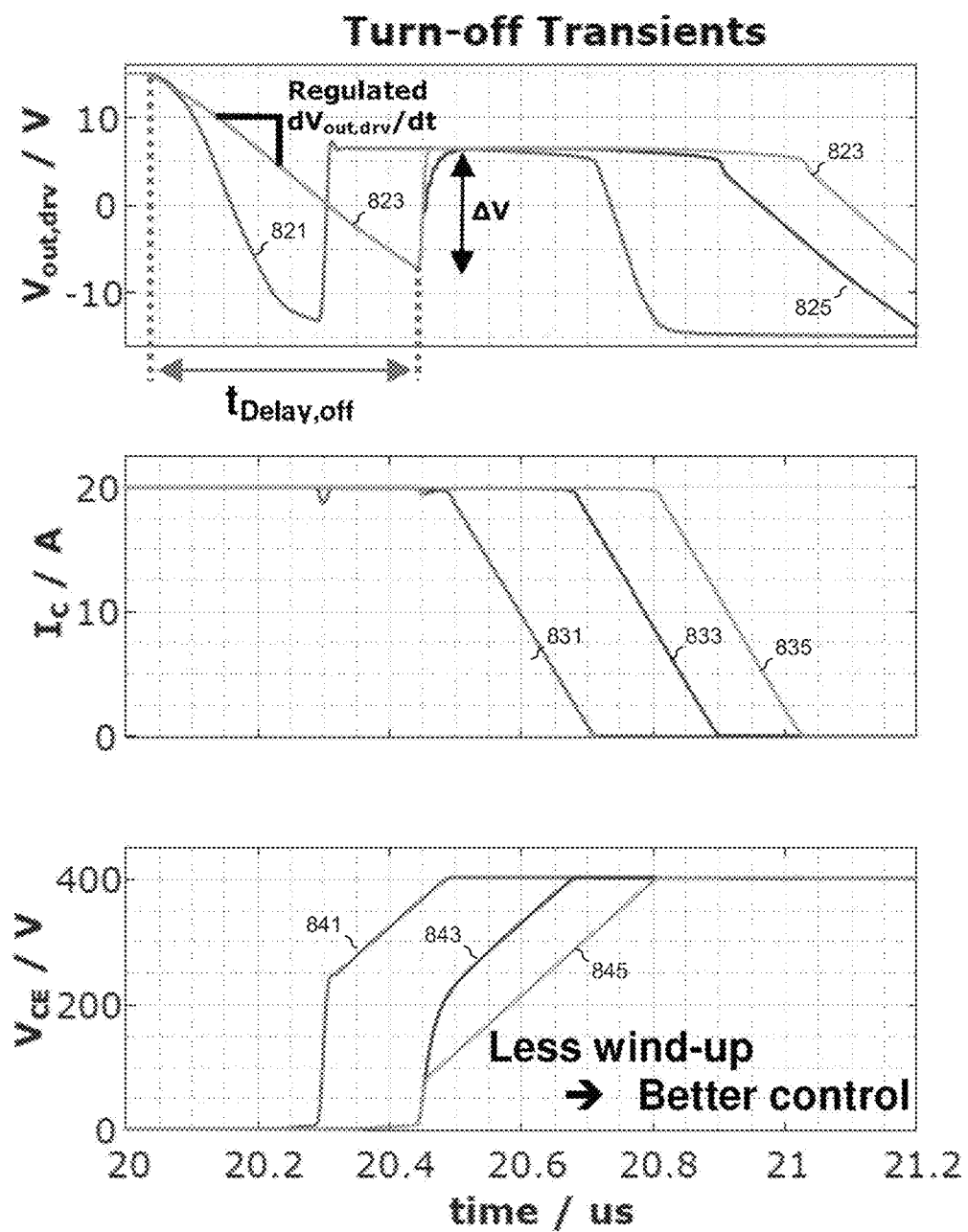

FIG. 8C includes waveform diagrams showing a comparison of turn-off behavior using embodiment $dV_{out,Driver}/$ dt slew rate control methods with respect to exemplary examples that do not utilize embodiment slew rate control methods. Trace 821 represents the gate driver output voltage $V_{out,Driver}$, trace 831 represents the collector current $I_C$, and trace 841 represents the collector-emitter voltage $V_{CE}$ of semiconductor device 106 for an exemplary example that does not utilize embodiment slew rate control methods. Trace 823 represents the gate driver output voltage $V_{out,Driver}$, trace 833 represents the collector current $I_C$, and trace 843 represents the collector-emitter voltage $V_{CE}$ of semiconductor device 106 for embodiments in which the control of $dV_{out,driver}/dt$ is permanently enabled. Trace 825 represents the gate driver output voltage $V_{out,Driver}$, trace 835 represents the collector current $I_C$, and trace 845 represents the collector-emitter voltage $V_{CE}$ of semiconductor device 106 for embodiments in which the control of $dV_{out,driver}/dt$ is deactivated when not needed after the delay phases. As can be seen in FIG. 8C, trace 825 representing the case in which the control of $dV_{out,driver}/dt$ is deactivated when not needed has a faster settling time after time period $t_{Delay,off}$ than trace 823 representing the case in which the control of $dV_{out,driver}/dt$ is permanently enabled. Thus, in some embodiments, $dV_{out,driver}/dt$ control is deactivated when $dV_{out,driver}/dt$ is positive and is activated when $dV_{out,driver}/dt$ is negative. However, in other embodiments, acceptable performance may be achieved when $dV_{out,driver}/dt$ control is activated when $dV_{out,driver}/dt$ is both positive and negative since the dv/dts of waveforms 823 and 825 have the same value after the Miller plateau.

In various embodiments, the delay time $t_{Delay,on}$, which is the time until the threshold of semiconductor device 106 is reached during turn-on, may be directly controlled by controlling the slew rate $dV_{out,driver}/dt$ of the driver:

$$t_{Delay,on} = \frac{V_{th} - V_{off} + \Delta V}{\frac{dV_{out,driver}}{dt}}, \quad (1)$$

where $V_{th}$ is the gate threshold voltage of the semiconductor device 106, $V_{off}$ is the gate voltage in off state (as for example the frequently used values 0V, −8V or −15V), and $\Delta V$ is an error voltage that is described in more detail below.

At turn-off, the delay time $t_{Delay,off}$ is the time when the gate is discharged from the on-state voltage $V_{on}$ to the Miller Plateau voltage $V_{Miller}$. This gate turn-off time can be controlled by selecting the appropriate slew rate as follows:

$$t_{Delay,off} = \frac{V_{on} - V_{Miller} - \Delta V}{\frac{dV_{out,driver}}{dt}} \quad (2)$$

Figure 8D:
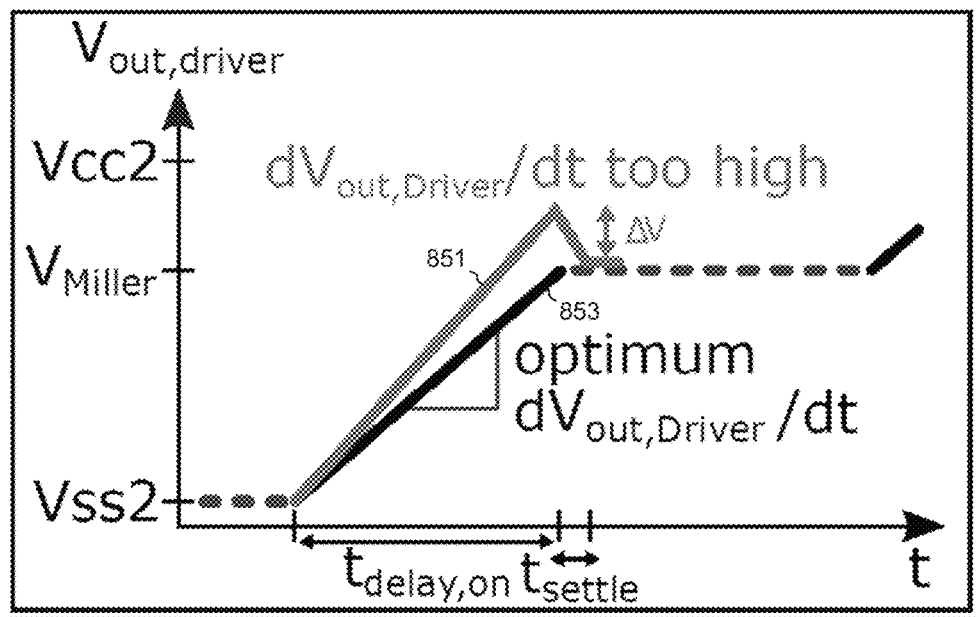
Figure 8E:
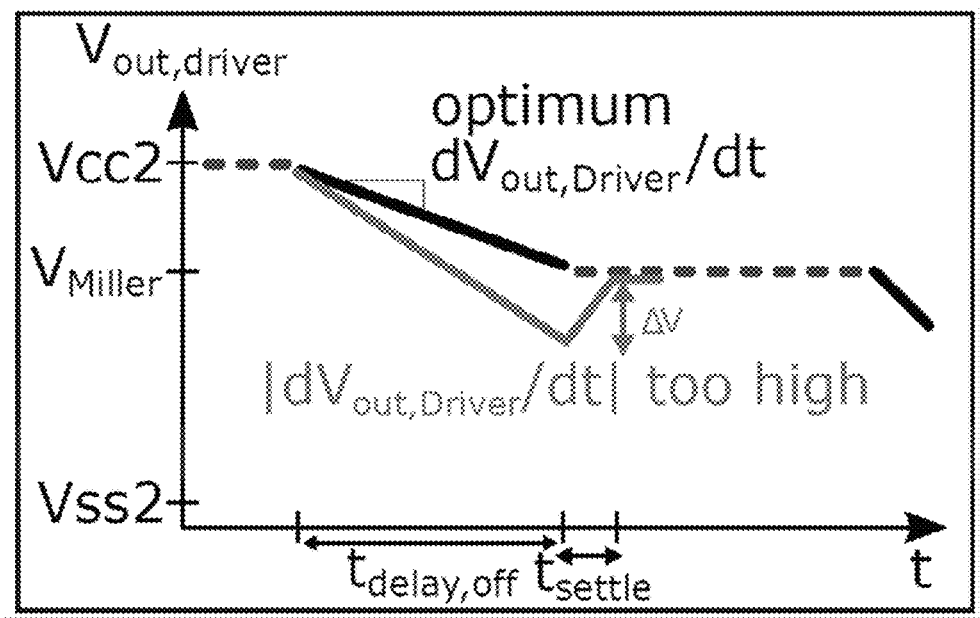

The term $\Delta V$ in equations (1) and (2) represents an error voltage resulting from not properly adjusting the $dV_{out,driver}/dt$ to the voltage difference that accumulated during the delay. If the $dV_{out,driver}/dt$ under control is fit in a way such that the gate current during the delay is at the level of the gate current later required for the following control ($dI_C/dt$ at turn-on and $dV_{CE}/dt$ at turn-off), it is at a value that will lead to a smooth transition to the regulation which becomes active in the following ($dI_C/dt$ at turn-on and $dV_{CE}/dt$ at turn-off). If $dV_{out,driver}/dt$ leads to a final value of the gate voltage being different from the Miller Plateau voltage $V_{Miller}$, a non-zero error voltage $\Delta V$ will result, which leads to a settling time $t_{settle}$ after the delay. Accordingly the $dI_C/dt$ or $dV_{CE}/dt$ regulation loop following will need an increased time (e.g., $t_{settle}$) to establish control. The error voltage $\Delta V$ may be expressed as follows:

$$\Delta V = R_G(I_{G,Delay} - I_{G,dI/dt}) \text{(at Turn-On)} \quad (3)$$

$$\Delta V = R_G(I_{G,Delay} - I_{G,dV/dt}) \text{(at Turn-Off)}, \quad (4)$$

where $R_G$ is a resistance coupled in series with the gate of semiconductor device 106, $I_{G,Delay}$ is the value of the current flowing into the gate of semiconductor device 106 during the switching delay while the control loop of $dV_{out,driver}/dt$ is active and $I_{G,dV/dt}$ is the value of the current flowing into the gate of semiconductor device 106 during the $V_{CE}$ transient while the control loop of $dV_{CE}/dt$ is active. FIGS. 8D and 8E illustrate waveform diagrams that provide a comparison between a driver output voltage $V_{out,driver}$ in which the absolute value of the controlled $dV_{out,driver}/dt$ is too high (trace 851) and a driver output voltage $V_{out,driver}$ having a $dV_{out,driver}/dt$ that creates a zero error voltage $\Delta V$ (trace 853). FIG. 8D shows driver output voltage $V_{out,driver}$ at turn-on and FIG. 8E shows driver output voltage $V_{out,driver}$ at turn-off. In some embodiments, the $dV_{out,driver}/dt$ is adjusted such that error voltage $\Delta V$ is close to zero. However, in some embodiments a small residual error may result in some practical applications.

Figure 9A:
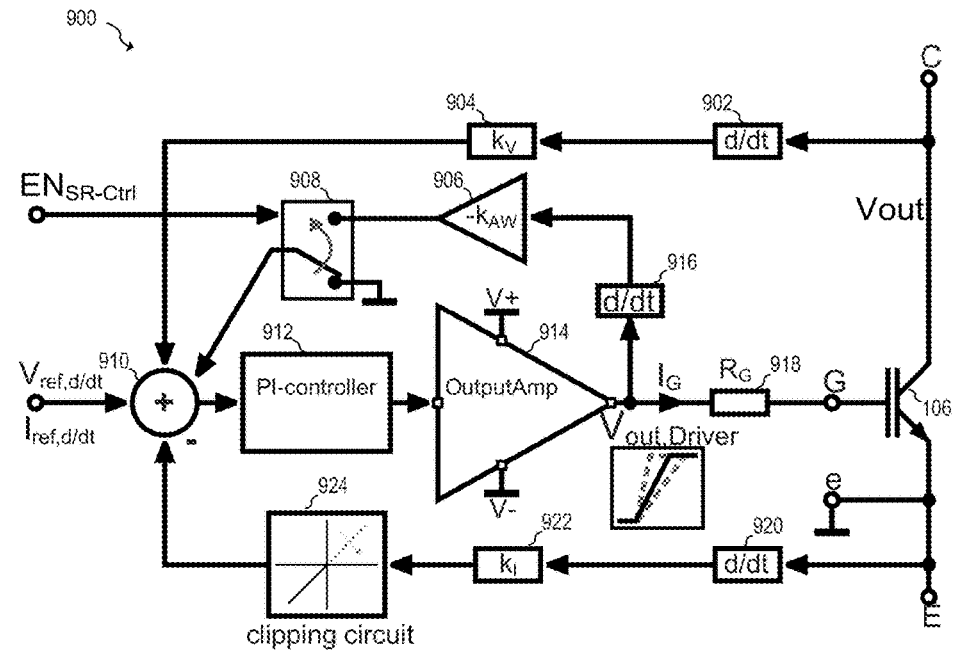
FIGS. 9A and 9B illustrate schematic of embodiment gate drive circuits.

In some embodiments, the regulation of the slew rate of the driver output voltage $dV_{out,Driver}/dt$ is achieved in addition to regulating the $dI_C/dt$ and the $dV_{CE}/dt$ of semiconductor device by adding an additional feedback branch devoted to regulating $dV_{out,driver}/dt$ to the river, existing embodiment driver circuit, thereby allowing for the regulation of $dI_C/dt$, $dV_{CE}/dt$ and $dV_{out,Driver}/dt$ using a single PI controller. The basic idea of this additional slew rate control is to prevent the driver from saturating (either voltage saturation or current saturation) by controlling the slew rate of the amplifier output ($dV_{out,Driver}/dt$) during the turn-on and turn-off switching delay phases. An example of one such embodiment circuit is shown in FIG. 9A, which illustrates a schematic of switching system 900.

As shown, switching system 900 includes semiconductor device 106 having a gate node G that is driven by output amplifier 914 having an output coupled in series with resistor 918. Amplifier 914 may also be referred to as a buffer circuit. A component feedback circuit provides the time derivative of the load path voltage and the load path current of semiconductor device 106. In some embodiments, this component feedback circuit includes a first feedback path devoted to the time derivative of the load path voltage of semiconductor device 106 and a second feedback path devoted to the time derivative of the load path current of semiconductor device 106. The first feedback path configured to provide $dV_{CE}/dt$ feedback to the system includes differentiator 902 and gain block 904 coupled between the collector node C of semiconductor device 106 and summing circuit 910; and the second feedback path configured to provide $dI_C/dt$ feedback to the system includes differentiator 920 and gain block 922 coupled between emitter node E of semiconductor device 106 and summing circuit 910. In some embodiments, clipping circuit 924 is coupled between gain block 922 and summing circuit 910, while in other embodiments, clipping circuit 924 is omitted and the output of gain block 922 is coupled with summing circuit 910.

The circuit also includes a gate drive feedback circuit that may be implemented as a third feedback path configured to provide $dV_{out,Driver}/dt$ feedback to the system includes differentiator 916 and gain block 906 coupled between the output of amplifier 914 and summing circuit 910. This gate drive feedback circuit may also be referred to as an antiwindup circuit. A single PI controller 912 is coupled between the output of summing block 910 and the input of output amplifier 914. The output of summing block may be referred to as an error signal. In alternative embodiments, PI controller 912 may be implemented using other dynamic controller structures known in the art, for example a P or PID controller. In various embodiments, the polarity of the feedback signals provided by the various feedback loops and summing circuit 910 is configured such that each loop provides negative feedback.

In various embodiments, a reference signal $V_{ref,d/dt}$ and/or $I_{ref,d/dt}$ is introduced at an input of summing circuit 910 to provide an input reference signal for the control loop. In some embodiments, signal $V_{ref,d/dt}$ is set to a value proportional to a target slew rate of the driver output voltage $dV_{out,Driver}/dt$. In some embodiments, reference signal $V_{ref,d/dt}$ and/or $I_{ref,d/dt}$ is asserted in response to a switch control signal, such as a pulse-width modulated (PWM) signal.

The determination of the overall polarity of each feedback path may be set and determined anywhere within the signal path of each loop. For example, negative feedback in the $dV_{CE}/dt$ may be set by configuring the polarity of differentiator 902, gain block 904 and/or the polarity of summing circuit 910. It should be understood that while the feedback inputs to summing circuit 910 are shown with inverting inputs indicated by each respective negative sign "-", in alternative embodiments, each input of the feedback summing block may be configured with the requisite polarity (either positive or negative) to ensure negative feedback and/or stable operation.

In some embodiments, switch 908 is coupled between gain block 906 and summing circuit 910. In one embodiment, switch 908 coupled the output of gain block 906 to summing circuit 910 when signal $EN_{SR-Ctrl}$ is asserted and provides a zero output (or ground) to summing circuit 910 when signal $EN_{SR-Ctrl}$ is not asserted. In such embodiments, signal $EN_{SR-Ctrl}$ is asserted during the initial time period $t_{delay,on}$ when the voltage of the gate node approaches Miller plateau $V_{Miller}$ and is then disabled. In other embodiments, switch 908 may be omitted.

Summing circuit 910 may be implemented using analog summing circuits known in the art such as adder circuits based on operational amplifiers or current summing nodes. In some embodiments, summing circuit 910 may be implemented as a node in which currents are summed as described below with respect to FIGS. 11A and 11B.

In various embodiments, differentiators 902, 916 and 920 are implemented using differentiator structures known in the art, and gain blocks 904, 906 and 922 are implemented using various circuits known in the art to provide gain or attenuation as described in embodiments above. For example, differentiators 902, 916 and 920 may be implemented using capacitors or inductances and gain blocks 904, 906 and 922 may be implemented using amplifiers or current mirrors. In some embodiments, one of more of gain blocks 904, 906 and 922 may be omitted in cases where the gain of the respective differentiator 902, 916 or 920 provides the adequate gain for the respective feedback path. In one embodiments described below, differentiator 916 is implemented using a capacitor and gain block 906 is implemented using a current mirror.

Figure 9B:
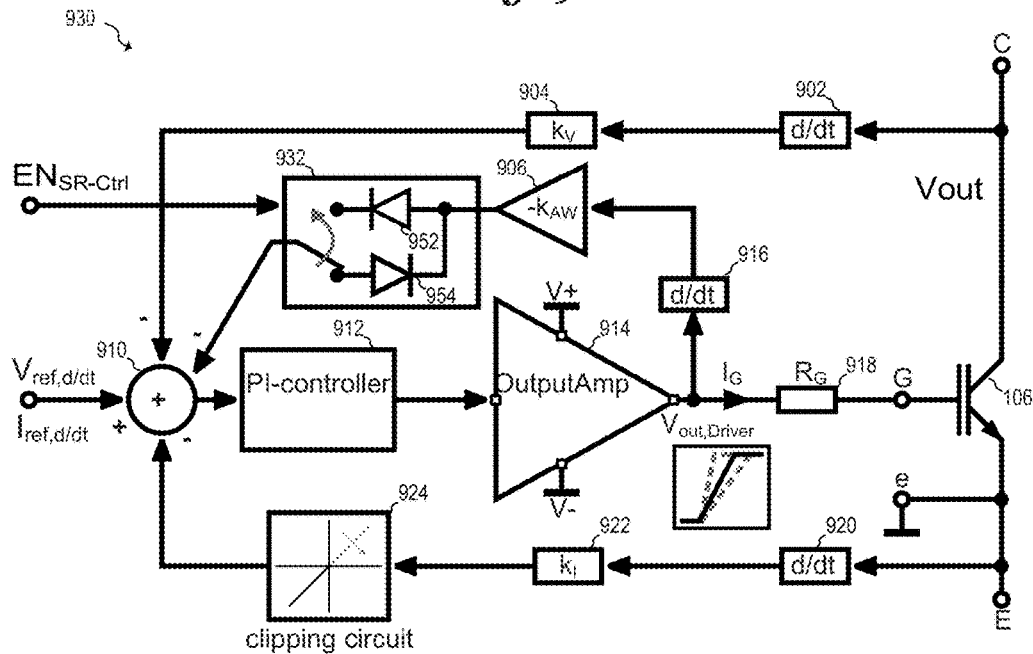

FIG. 9B illustrates switching system 930 according to an alternative embodiment of the present invention. Switching system 930 is similar to switch system 900 shown in FIG. 9A, with the exception that switch 908 is replaced by switch 932 that includes diodes 952 and 954. In an embodiment, each diode 952 and 954 represents a half-wave rectification operation that ensures that feedback from $dV_{out,Driver}/dt$ is provided to summing circuit 910 in a single direction (e.g. at a single polarity). For example, when semiconductor switch 106 is being turned on, control signal $EN_{SR-CTRL}$ may be set to a first state in order to select diode 954. Accordingly, diode 954 allows $dV_{out,Driver}/dt$ feedback in the positive direction to reach summing circuit 910, but blocks $dV_{out,Driver}/dt$ feedback in the negative direction. On the other hand, when semiconductor switch 106 is being turned off, control signal $EN_{SR-CTRL}$ may be set to a second state in order to select diode 952. Accordingly, diode 952 allows $dV_{out,Driver}/dt$ feedback in the negative to reach summing circuit 910, but blocks $dV_{out,Driver}/dt$ feedback in the positive direction.

In various embodiments, diodes 952 and 954 may be implemented using solid state diode devices. Alternatively, other known circuits and systems that rectify a signal and/or provides a signal at a single polarity may be used. For example, circuits such as current sources that operate at a single polarity may be used to implement diodes 952 and 954 as discussed further below.

Figure 10A:
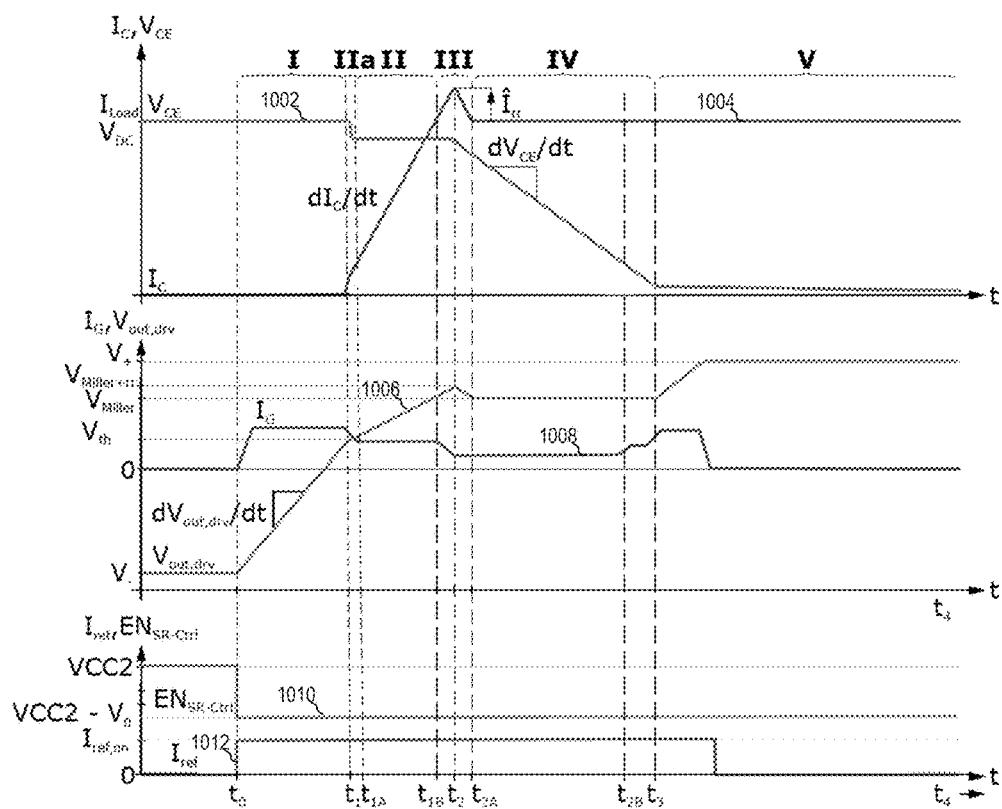
FIGS. 10A-10C illustrate waveform diagrams showing the performance of embodiment gate drive circuits.

FIG. 10A illustrates a waveform diagram showing various signals within switching system 930 when semiconductor device 106 is turned-on. As shown, trace 1002 represents the collector-emitter voltage $V_{CE}$ of semiconductor device 106; trace 1004 represents the load current of semiconductor device 106; trace 1006 represents the gate drive voltage $V_{out,drv}$ provided by amplifier 914 to the gate of semiconductor device 106; trace 1008 represents the gate current $I_G$ provided by amplifier 914 to the gate of semiconductor device 106; trace 1010 represents the switch control signal $EN_{SR-Ctrl}$ that selects diode 952 or 954 within switch 932; and trace 1012 represents reference current $I_{ref}$ that is introduced as the reference signal to summing circuit 910.

At time $t_0$, the process of turning on semiconductor device 106 begins when reference current $I_{ref}$ (1012) transitions from zero to current $I_{ref,on}$ and switch control signal $EN_{SR-Ctrl}$ (1010) transitions low, thereby selecting one of diodes 952 or 954 that allows $dV_{out,Driver}/dt$ feedback in the positive direction to reach summing circuit 910, but blocks $dV_{out,Driver}/dt$ feedback in the negative direction. During phase I, which is between times $t_0$ and $t_1$ gate drive voltage $V_{out,drv}$ (1006) increases in a controlled manner with a constant slew rate (e.g., constant $dV_{out,Driver}/dt$) while gate current $I_G$(1008) charges the gate of semiconductor device 106. The collector-emitter voltage $V_{CE}$ (1002) of semiconductor device 106 remains high and the load current of semiconductor device 106 remains at zero during phase I because the gate drive voltage $V_{out,Driver}$ (1006) has not yet reached the threshold voltage of semiconductor device 106.

At time $t_1$ at the beginning of phase IIa, gate drive voltage $V_{out,Driver}$ (1006) reaches the threshold of semiconductor device, and semiconductor device begins to turn-on. During phase II between times $t_{1A}$ and $t_{1b}$, the load current $I_C$ (1004) of semiconductor device 106 increases at a controlled rate $dI_C/dt$ that is set by the controller, which in most cases has the effect of decreasing the slew rate $dV_{out,Driver}/dt$ of gate drive voltage $V_{out,drv}$ (1006).

During the first portion of phase III, which is between times $t_{1B}$ and $t_2$, the gate drive voltage $V_{out,Driver}$ (1006) slightly overshoots Miller Plateau voltage $V_{Miller}$ causing a slight overshoot $\hat{I}_{rr}$ in the load current $I_C$ (1004) of semiconductor device 106. During the second portion of phase III, which is between times $t_2$ and $t_{2A}$, the gate drive voltage $V_{out,Driver}$ (1006) returns to Miller Plateau voltage $V_{Miller}$ and the collector-emitter voltage $V_{CE}$ of semiconductor device 106 decreases with at a controlled rate $dV_{CE}/dt$ that is set by the controller. During phase IV between times $t_{2A}$ and $t_3$, the collector-emitter voltage $V_{CE}$ (1002) of semiconductor device 106 continues at the controlled rate $dV_{CE}/dt$ until the collector-emitter voltage $V_{CE}$ (1002) reaches zero. After time $t_3$, reference current $I_{ref}$(1012) transitions back to zero, which effectively turns off gate current $I_G$(1008).

Figure 10B:
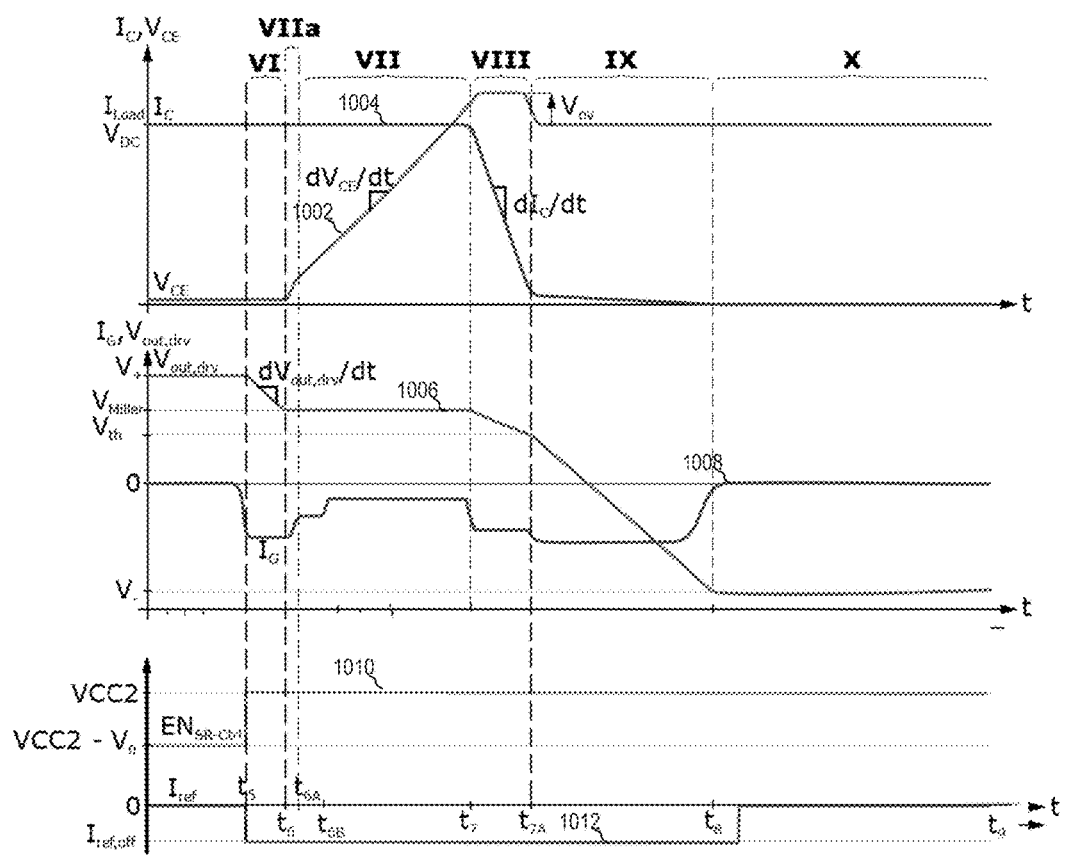

FIG. 10B illustrates a waveform diagram showing various signals within switching system 930 when semiconductor device 106 is turned-off. At time t 5, the process of turning off semiconductor device 106 begins when reference current $I_{ref}$(1012) transitions from zero to current $I_{ref,off}$ and switch control signal $EN_{SR-Ctrl}$ (1010) transitions high, thereby selecting one of diodes 952 or 954 that allows $dV_{out,Driver}/dt$ feedback in the negative direction to reach summing circuit 910, but blocks $dV_{out,Driver}/dt$ feedback in the positive direction. During phase VI, which is between times $t_5$ and $t_6$, gate drive voltage $V_{out,drv}$ (1006) decreases in a controlled manner with a constant slew rate (e.g., constant $dV_{out,Driver}/dt$) while gate current $I_G$ (1008) discharges the gate river, of semiconductor device 106. The collector-emitter voltage $V_{CE}$ (1002) of semiconductor device 106 remains low and the load current of semiconductor device 106 remains at $I_{Load}$ during phase VI because the gate drive voltage $V_{out,Driver}$ (1006) has not yet reached the Miller Plateau voltage $V_{miller}$.

At time $t_6$ at the beginning of phase VIIa, gate drive voltage $V_{out,Driver}$ (1006) reaches the Miller Plateau voltage $V_{Miller}$, and semiconductor device begins to turn-off. During phase VII between times $t_{6A}$ and $t_7$, the collector-emitter voltage $V_{CE}$ (1002) of semiconductor device 106 increases at a controlled rate $dV_{CE}/dt$ that is set by the controller while gate drive voltage $V_{out,Driver}$ (1006) remains at the Miller Plateau voltage $V_{Miller}$. During phase VIII between times $t_7$ and $t_{7A}$, the gate drive voltage $V_{out,Driver}$ (1006) approaches the threshold voltage $V_{th}$ of semiconductor device 106 while the load current $I_C$ (1004) of semiconductor device 106 decreases at a controlled rate $dI_C/dt$ that is set by the controller.

During phase IX between times $t_{7A}$ and $t_8$, gate drive voltage $V_{out,Driver}$ (1006) continues to decrease until the gate drive voltage $V_{out,Driver}$ (1006) reaches a minimum value at time $t_8$. At time $t_8$, phase X begins and reference current $I_{ref}$ (1012) transitions back to zero, which effectively turns off gate current $I_G$(1008).

Figure 10C:
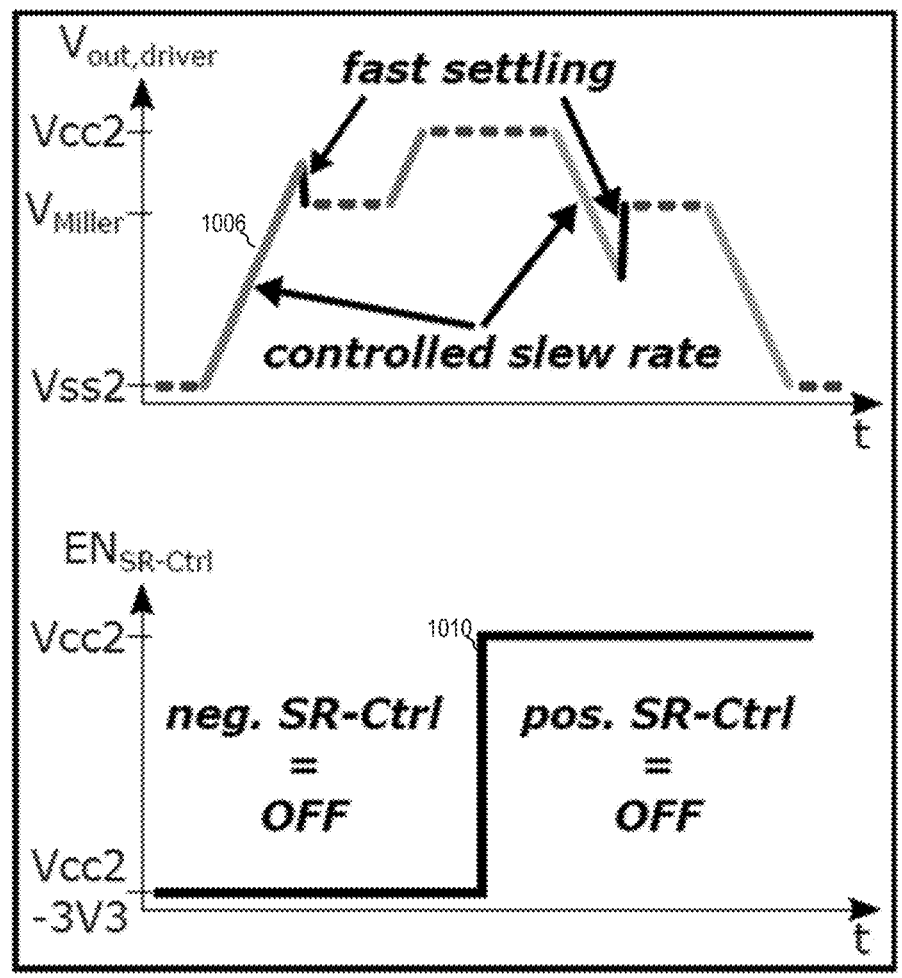

FIG. 10C is a simplified waveform diagram that further illustrates the effect of selecting diodes 952 and 954 within switch 932 based on whether semiconductor device 106 is being turned-on or turned-off. As shown, during the turn-on phase when switch control signal $EN_{SR-Ctrl}$ (1010) is low and $dV_{out,Driver}/dt$ feedback in the positive direction is allowed but is blocked in the negative direction, gate drive voltage $V_{out,drv}$ (1006) increases in a controlled manner with a fixed slew rate in the positive direction. However, if gate drive voltage $V_{out,drv}$ (1006) overshoots the Miller Plateau voltage $V_{Miller}$, gate drive voltage $V_{out,drv}$ (1006) decreases to the Miller Plateau voltage $V_{Miller}$ faster (e.g. at a higher slope) when approaching Miller Plateau voltage $V_{Miller}$ in a negative direction. This faster settling is due to the absence of $dV_{out,Driver}/dt$ in the negative direction.

Similarly, during the turn-off phase when switch control signal $EN_{SR-Ctrl}$ (1010) is high and $dV_{out,Driver}/dt$ feedback in the negative direction is allowed but is blocked in the positive direction, gate drive voltage $V_{out,drv}$ (1006) decreases in a controlled manner with a fixed slew rate in the negative direction. However, if gate drive voltage $V_{out,drv}$ (1006) undershoots the Miller Plateau voltage $V_{Miller}$, gate drive voltage $V_{out,drv}$ (1006) increases to the Miller Plateau voltage $V_{Miller}$ faster (e.g. at a higher slope) when approaching Miller Plateau voltage $V_{Miller}$ in a positive direction.

Figure 11A:
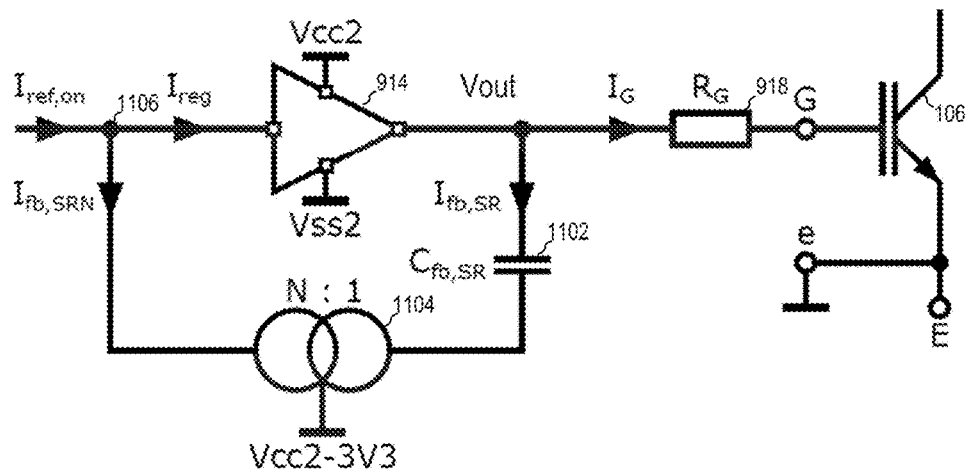
FIGS. 11A and 11B illustrate feedback circuits that can be used to implement embodiment gate driver circuits.

FIG. 11A illustrates a circuit implementation of an embodiment $dV_{out,Driver}/dt$ feedback loop. As shown the output of amplifier 914 is monitored by a feedback circuit that includes capacitor 1102 followed by a current mirror 1104, the output of which is coupled to the input of amplifier 914 at current summing node 1106. In some embodiments, capacitor 1102 performs the function of differentiator 916, current mirror 1104 performs the function of gain block 906, and current summing node 1106 performs the function of summing circuit 910 shown in FIGS. 9A and 9B. Current mirror 1104 may be implemented, for example, using current mirror and/or current amplifier circuits known in the art.

The reference current $I_{ref,on}$ is injected into the regulation loop by an arbitrary constant current source and it is controlled by the turn-on/turn-off signal. The current is then converted into a voltage in the summing node at the input of the buffer. A positive reference current leads to a positive $dV_{out,driver}/dt$, a negative reference current to a negative $dV_{out,driver}/dt$.

As shown in FIG. 11A, a displacement current $I_{fb,SR}$ is generated through capacitor 1102 having a capacitance $C_{fb,SR}$ as soon as the output voltage $V_{out}$ of amplifier 914 changes. This current is defined by $$I_{fb,SR} = C_{fb,SR} \frac{dV_{out,drv}}{dt}. \tag{5}$$

Hence, displacement current $I_{fb,SR}$ is proportional and contains the information about the driver output slew rate $dV_{out,driver}/dt$. This current is mirrored by a factor of N and fed back to the input of amplifier 914 in order to control the slew rate in a closed loop with negative feedback. Consequently, the feedback gain of this additional control loop is determined by the capacitance $C_{fb,SR}$ of capacitor 1102 and the ratio N:1 of the current mirror 1104. If the output voltage $V_{out,driver}$ is river, falling and hence $dV_{out,driver}/dt$ is negative, the feedback currents $I_{fb,SR}$ and $I_{fb,SRN}$ change their direction and the falling slew rate is controlled. Accordingly, the value $dV_{out,driver}/dt$ depends on these mentioned loop gain parameters (capacitor, current mirror ratio) as well as on the reference current $I_{ref,on}$.

In an alternative embodiment, the slew rate of the output voltage of amplifier 914 can also be controlled directly at the gate of semiconductor device 106 (at the node between the gate resistor 918 and the power switch). In a further embodiment, the gate resistor 918 can also be removed (set to zero) such that the output of amplifier 914 and the gate of the IGBT is the same node, and its slew rate is controlled.

Figure 11B:
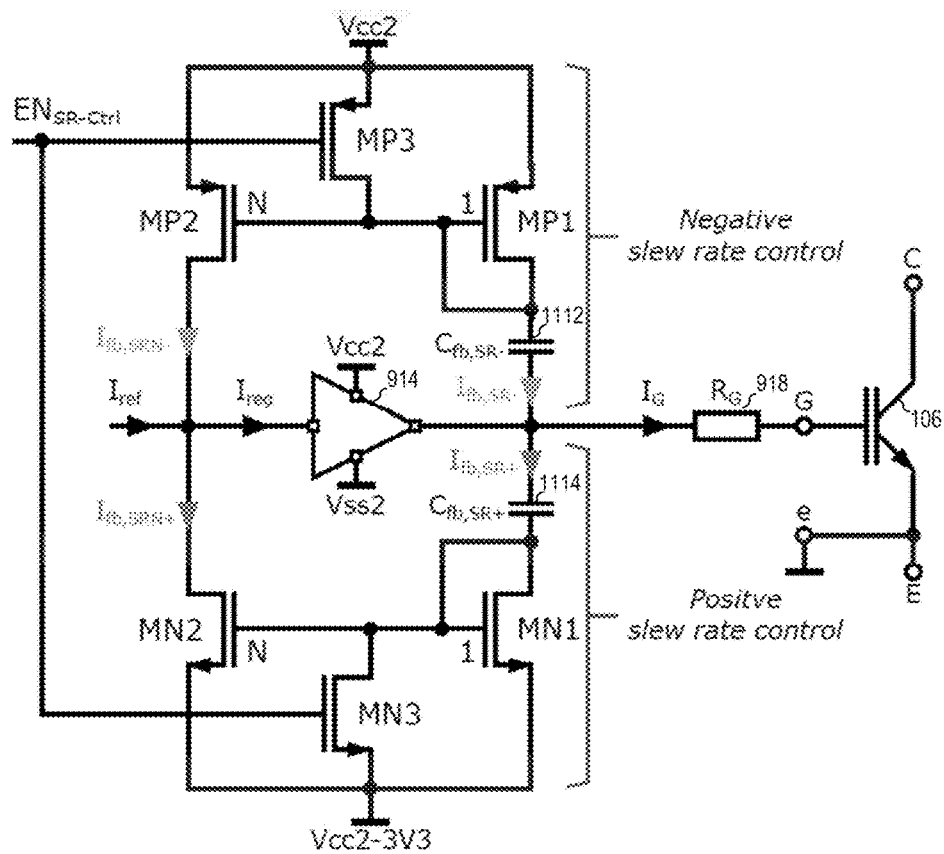

FIG. 11B illustrates a circuit implementation of a $dV_{out,Driver}/dt$ feedback loop according to a further embodiment of the present invention. As shown, the function of gain block 906 and switch 932 (including the functions of diodes 952 and 954) shown in FIG. 9B is implemented using a selectable current source that includes NMOS transistors MN1, MN2 and MN3 and PMOS transistors MP1, MP2 and MP3. The function of differentiator 916 shown in FIG. 9B is implemented using capacitors 1112 and 1114.

When control signal $EN_{SR-CTRL}$ is low, a low-side current mirror implemented by NMOS transistors MN1 and MN2 is enabled by turning off NMOS transistor MN3, and a high-side current mirror implemented by PMOS transistors MP1 and MP2 is disabled by coupling the gates of PMOS transistors MP1 and MP2 to Vcc2 by turning on PMOS transistor MP3. During operation, the output of amplifier 914 is coupled to diode connected NMOS transistor MN1 via capacitor 1114. NMOS transistor MN2, having a gate coupled to the gate of NMOS transistor MM, mirrors the current flowing in transistor MN1 to the input of amplifier 914 to provide positive slew rate control. In some embodiments, the width of NMOS transistor MN2 is N times larger than the width of NMOS transistor MN1 in order to achieve a current gain of N.

When control signal $EN_{SR-Ctrl}$ is high, the low-side current mirror implemented by NMOS transistors MN1 and MN2 is disabled by turning on NMOS transistor MN3, thereby shutting off NMOS transistors MN1 and MN2. The high-side current mirror implemented by PMOS transistors MP1 and MP2 is enabled by turning off PMOS transistor MP3. During operation, the output of amplifier 914 is coupled to diode connected PMOS transistor MP1 via capacitor 1112. PMOS transistor MP2, having a gate coupled to the gate of PMOS transistor MP1 mirrors the current flowing in transistor MP1 to the input of amplifier 914 to provide negative slew rate control. In some embodiments, the width of PMOS transistor MN2 is N times larger than the width of PMOS transistor MP1 in order to achieve a current gain of N.

In various embodiments, current mirror ratio N is selected to provide a desired $dV_{out,Driver}/dt$ feedback level. In some embodiments, the current mirror ratio N may be programmable and/or trimmable. In further embodiments, the ratio of the width of PMOS transistors MP1 and MP2 may be different from the ratio of the width of NMOS transistor MN1 and MN2. In some embodiments, the amount of $dV_{out,Driver}/dt$ feedback may also be set by selecting the size of capacitors 1112 and 1114.

It should be appreciated the use of current mirrors to provide current feedback between the output and input of amplifier 914 provides the ability to provide feedback in a single direction. For example, when the NMOS current mirror is selected, only positive excursions of the output voltage of amplifier 914 is mirrored to the input of amplifier 914, while negative excursions of the output voltage of amplifier 914 essentially shuts off the NMOS current mirror. Similarly, when the PMOS current mirror is selected, only negative excursions of the output voltage of amplifier 914 is mirrored to the input of amplifier 914, while positive excursions of the output voltage of amplifier 914 essentially shuts off the PMOS current mirror. Accordingly, the use of current mirrors in the embodiment circuit of FIG. 11B essentially performs the rectification function of diodes 952 and 954 shown in the embodiment of FIG. 9B and affects a system performance described above with respect to FIG. 10C. It should be further appreciated that the circuit implementations examples shown in FIGS. 11A and 11B are just two specific examples of many possible example implementations. In alternative embodiments of the present invention, the different transistor types and different current mirror/current amplifier topologies known in the art may be used to implement embodiment $dV_{out,Driver}/dt$ feedback circuits.

Figure 12A:
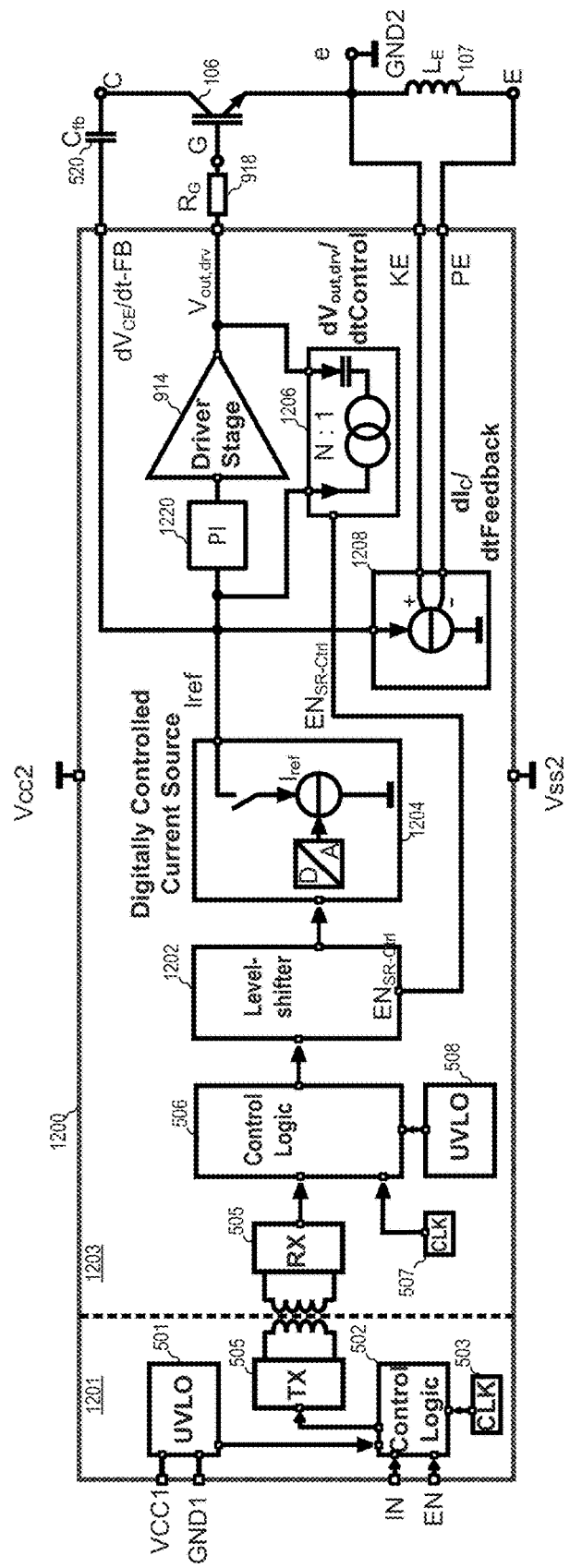
FIGS. 12A and 12B illustrate embodiment gate driver integrated circuits.

FIG. 12A illustrates an embodiment driver integrated circuit 1200 coupled to semiconductor device 106 that implements embodiment $dV_{out,Driver}/dt$ control techniques. Similar to the embodiments of FIGS. 5, 6 and 7, driver integrated circuit 1200 includes a low voltage circuitry part 1201 and a higher voltage circuitry part 1203 galvanically isolated from the low voltage circuitry part. The low voltage circuitry part 1201 includes an under voltage lockout (UVLO) block 501 that receives a (positive) supply voltage VCC1 of the integrated circuit device 500 and first ground GND1 to which the integrated circuit device 500 is referred as explained above with respect to FIG. 5. The low voltage circuitry part 1201 also includes logic block 502, clock signal generator 503 and galvanically isolated signal coupler 505 as explained above with respect to FIGS. 5-7. Higher voltage circuitry part 1203 of driver integrated circuit 1200 includes control block 506, clock signal generator 507, and under voltage lockout block 508 as is also explained above with respect to FIGS. 5-7. In some embodiments, integrated circuit 1200 is implemented on a single semiconductor substrate. Alternatively, low voltage circuitry part 1201 is implemented on a first single semiconductor substrate and higher voltage circuitry part 1203 is implemented on a second single semiconductor substrate. In further alternative embodiments, integrated circuit 1200 may be partitioned differently. For example, all or part of integrated 1200 may be implemented using discrete circuit elements.

Higher voltage circuitry part 1203 also includes an amplifier 914 having an output coupled to the gate of semiconductor device 106 via resistor 918 and having an input coupled to dynamic controller 1220. While dynamic controller 1220 is depicted as a PI controller, it should be understood that any suitable dynamic controller known in the art may be used. The summing node is implemented as a current summing node at the input to dynamic controller 1220. Three feedback paths provide feedback from the output of amplifier 914 or from semiconductor device 106 back to the input of amplifier 914. A $dV_{CE}/dt$ feedback path includes capacitor 520 coupled between the collector of semiconductor device 106 and the input of dynamic controller 1220; a $dI_C/dt$ feedback path includes parasitic inductance 107 and $dI_C/dt$ feedback block 1208 coupled between the emitter of semiconductor device 106 and the input of dynamic controller; and an embodiment $dV_{out,Driver}/dt$ feedback path includes $dV_{out,Driver}/dt$ feedback block 1206 coupled between the output of amplifier 914 and the input of dynamic controller 1220. A reference current is introduced to the input of dynamic controller 1220 via digitally controlled current source 1204 that is configured to produce a current based on a digital word generated by control block 506 and level shifted via level shifter block 1202. As depicted in FIG. 12A, digitally controlled current source 1204 includes a digital-to-analog converter followed by a controllable current source to produce reference current $I_{ref}$. Level shifter block 1202 is configured to level shift digital signals obtained from control block 506 and produce the digital input to digitally controlled current source 1204 and embodiment switch/polarity signal $EN_{SR-Ctrl}$.

In various embodiments, $dI_C/dt$ feedback block 1208 monitors the voltage across parasitic inductance 107 and provides a current proportional that is proportional to the first derivative of the collector current of semiconductor device 106. The structure of $dI_C/dt$ feedback block 1208 may be implemented using the various circuit and systems disclosed in FIGS. 1-7 for monitoring $dI_C/dt$ via parasitic inductance 107.

The $dV_{out,Driver}/dt$ feedback block 1206 includes embodiment $dV_{out,Driver}/dt$ feedback circuitry described hereinabove with respect to FIGS. 9A, 9B, 11A and 11B. For example, in some embodiments, $dV_{out,Driver}/dt$ feedback block 1206 includes a capacitor coupled in series with a controllable current source, such as a current mirror shown as depicted in FIG. 9A. In embodiments that provide $dV_{out,Driver}/dt$ in a single direction depending on whether semiconductor device 106 is being turned-on or turned off, $dV_{out,Driver}/dt$ feedback block 1206 may include a pair of selectable current mirrors having a respective input capacitor coupled in series with the input of each respective current mirror, such as is described above with respect to FIG. 11B. The active current mirror may be selected in accordance with control signal $EN_{SR-CTRL}$. In some embodiments, $dV_{out,Driver}/dt$ feedback block 1206 includes a differentiator coupled in series with gain block and a switch as is described with respect to FIGS. 9A and 9B. The switch may be configured to enable or disable $dV_{out,Driver}/dt$ (FIG. 9A), or may be configured to select a diode and/or rectification direction based on control signal $EN_{SR-CTRL}$.

Figure 12B:
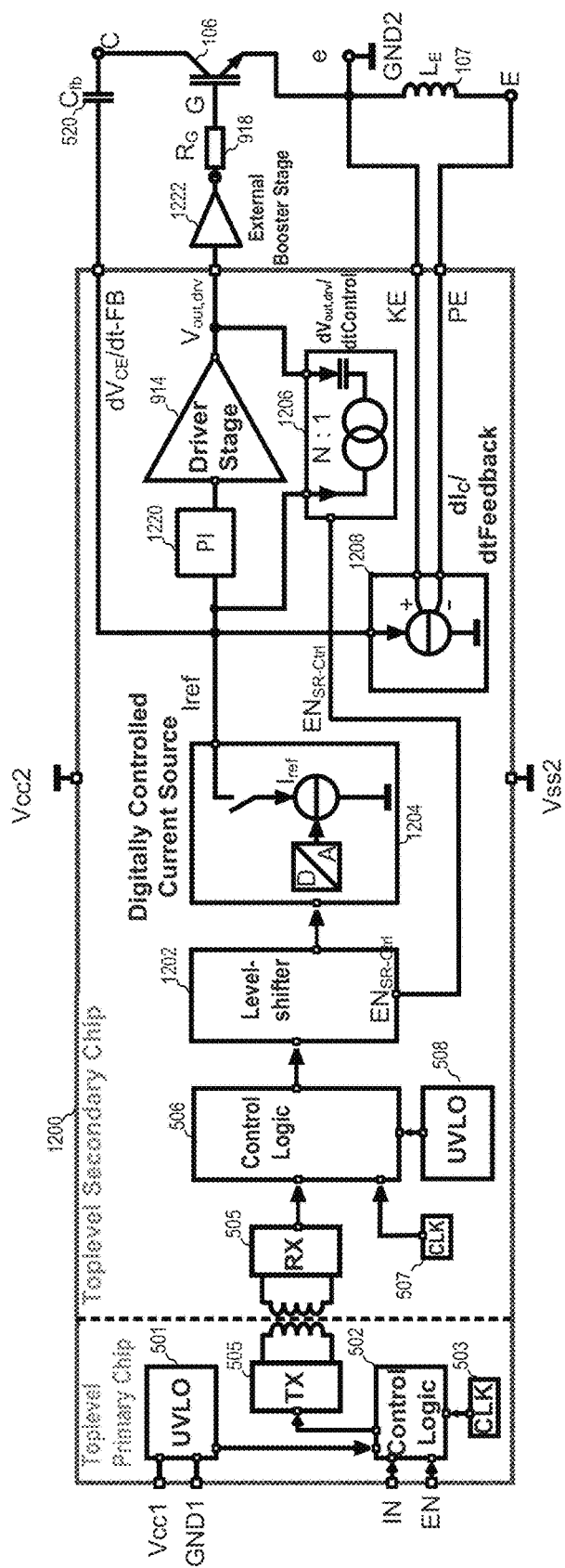

FIG. 12B illustrates an embodiment driver integrated circuit 1200 coupled to semiconductor device 106 according to a further embodiment of the present invention. The embodiment of FIG. 12B is similar to the embodiment of FIG. 12A with the addition of an external booster stage 1222 coupled between the output of amplifier 914 and the gate of semiconductor device 106. External booster stage 1222 may be used in embodiments in which semiconductor device 106 is very large and additional drive is needed to operate the device. One advantage of the embodiment of FIG. 12B is the ability to support an external booster stage and prevent (or reduce) the windup effect without adding additional pins for monitoring the output of the external booster stage 1222.

It should be appreciated that the implementations shown in FIGS. 12A and 12B are just two of many possible example system implementations that may be used to implement embodiment gate drive systems.

Example embodiments of the present invention are summarized here. Other embodiments can also be understood from the entirety of the specification and the claims filed herein.

Example 1

A gate drive circuit for controlling a gate-controlled component includes: a dynamic controller configured to receive an input reference signal and to control a gate voltage of the gate-controlled component via an output terminal of the gate drive circuit; at least one component feedback circuit for the dynamic controller, the at least one component feedback circuit configured to provide feedback from at least one of a time derivative of a load path voltage or a time derivative of a load path current of the gate-controlled component to the dynamic controller; and a gate drive feedback circuit for the dynamic controller, the gate drive feedback circuit configured to provide feedback from a time derivative of a voltage at the output terminal of the gate drive circuit.

Example 2

The gate drive circuit of example 1, further including a buffer circuit having an input coupled to an output of the dynamic controller and an output coupled to the output terminal of the gate drive circuit.

Example 3

The gate drive circuit of example 2, where the buffer circuit and the dynamic controller are disposed on a single semiconductor substrate.

Example 4

The gate drive circuit of one of examples 1 to 3, where the dynamic controller includes a proportional-integral (PI) controller.

Example 5

The gate drive circuit of one of examples 1 to 4, where the gate drive feedback circuit has a first gain of a first polarity when the gate drive circuit turns-on the gate-controlled component; and the gate drive feedback circuit has a second gain of a second polarity when the gate driver circuit turns-off the gate-controlled component, where the first polarity and the second polarity are configured to provide negative feedback.

Example 6

The gate drive circuit of example 5, where the gate drive feedback circuit is further configured to rectify the feedback from the time derivative of the voltage at the output terminal of the gate drive circuit.

Example 7

The gate drive circuit of one of examples 5 or 6, where the gate drive feedback circuit is configured to limit a positive slew rate of the voltage at the output terminal of the gate drive circuit when the gate drive circuit turns-on the gate-controlled component; and the gate drive feedback circuit is configured to limit a negative slew rate of the voltage at the output terminal of the gate drive circuit when the gate drive circuit turns-off the gate-controlled component.

Example 8

A circuit includes a gate driver circuit having an output coupled to a gate driving terminal, the gate driving terminal configured to be coupled to a gate of a switching transistor; a dynamic controller having an output coupled to an input of the gate driver circuit; a summing circuit having an output coupled to an input of the dynamic controller, and a first input configured to receive a reference signal; at least one feedback circuit coupled between a voltage measurement terminal and a second input of the summing circuit, the at least one feedback circuit configured to provide a signal proportional to at least one of a derivative of a load path voltage of the switching transistor and a derivative of a load path current of the switching transistor to the second input of the summing circuit; and an anti-windup circuit coupled between the output of the gate driver circuit and a third input of the summing circuit, the anti-windup circuit configured to provide a signal proportional to a derivative of an output voltage of the gate driver circuit to the third input of the summing circuit.

Example 9

The circuit of example 8, further including the switching transistor.

Example 10

The circuit of one of examples 8 or 9, where the at least one feedback circuit includes: a first feedback circuit configured to provide a first signal proportional to the derivative of a load path voltage to the second input of the summing circuit; and a second feedback circuit configured to provide a second signal proportional to the derivative of a load path current of the switching transistor to a fourth input of the summing circuit.

Example 11

The circuit of example 10, further including a clipping circuit coupled between an output of the second feedback circuit and the fourth input of the summing circuit.

Example 12

The circuit of one of examples 8-11, where the anti-windup circuit is configured to apply a first gain to the signal proportional to the derivative of the output voltage of the gate driver circuit when the gate driver circuit turns on the switching transistor; and apply a second gain to the signal proportional to the derivative of the output voltage of the gate driver circuit when the gate driver circuit turns off the switching transistor.

Example 13

The circuit of example 12, where the anti-windup circuit includes a first current mirror having an output coupled to the third input of the summing circuit; and a first capacitor coupled between the output of the gate driver circuit and an input of the first current mirror.

Example 14

The circuit of example 13, where the anti-windup circuit further includes a second current mirror having an output coupled to the third input of the summing circuit; and a second capacitor coupled between the output of the gate driver circuit and an input of the second current mirror.

Example 15

The circuit of example 14, where the first current mirror has a different mirror ratio from the second current mirror.

Example 16

The circuit of one of examples 12 to 15, where the first gain includes a first polarity, and the second gain includes a second polarity opposite the first polarity, where the first polarity and the second polarity are configured to provide negative feedback.

Example 17

The circuit of one of examples 8 to 16, further including an external booster stage having an input coupled to the gate driving terminal and an output configured to be coupled to the gate of the switching transistor.

Example 18

A method of driving a switching transistor includes driving the switching transistor with a gate drive signal; measuring at least one of a derivative of a load path voltage and a derivative of a load path current of the switching transistor; measuring a derivative of the gate drive signal; forming an error signal based on a reference signal, a measured derivative of the gate drive signal, and at least one of the measured derivative of the load path voltage of the switching transistor or the measured derivative of the load path current of the switching transistor; and forming the gate drive signal, where forming the gate drive signal includes processing the error signal using a dynamic controller.

Example 19

The method of example 18, where forming the gate drive signal further includes producing a control signal using the dynamic controller; driving an input of a gate driving circuit with the control signal; and generating the gate drive signal using the gate driving circuit.

Example 20

The method of one of examples 18 or 19, where driving the switching transistor with the gate drive signal includes driving a booster stage with the gate drive signal, where an output of the booster stage is coupled to a gate of the switching transistor.

Example 21

The method of one of examples 18 to 20, where the dynamic controller is a proportional-integral (PI) controller.

Example 22

The method of one of examples 18 to 21, further including; applying a first gain to the measured derivative of the gate drive signal prior to forming the error signal when turning on the switching transistor; and applying a second gain to the measured derivative of the gate drive signal prior to forming the error signal when turning off the switching transistor.

Example 23

The method of example 22, further including providing only a first polarity of the measured derivative of the gate drive signal prior to forming the error signal when turning on the switching transistor; and providing only a second polarity of the measured derivative of the gate drive signal prior to forming the error signal when turning off the switching transistor, where the second polarity is opposite the first polarity.

Example 24

The method of example 23, where: the first polarity represents a positive slew rate of the gate drive signal; and the second polarity represents a negative slew rate of the gate drive signal.

Example 25

The method of example 22, where the first gain includes a first polarity, and the second gain includes a second polarity opposite the first polarity.

Example 26

The method of one of examples 18 to 25, further including receiving a switch control signal, and generating the reference signal based on the received switch control signal.

Example 27

The method of example 26, where the switch control signal includes a pulse-width modulated signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A gate drive circuit for controlling a gate-controlled component, the gate drive circuit comprising:
    a dynamic controller configured to receive an input reference signal and to control a gate voltage of the gate-controlled component via an output terminal of the gate drive circuit;
    at least one component feedback circuit for the dynamic controller, the at least one component feedback circuit configured to provide feedback from at least one of a time derivative of a load path voltage or a time derivative of a load path current of the gate-controlled component to the dynamic controller; and
    a gate drive feedback circuit for the dynamic controller, the gate drive feedback circuit configured to provide feedback from a time derivative of a voltage at the output terminal of the gate drive circuit.

2. The gate drive circuit of claim 1, further comprising a buffer circuit having an input coupled to an output of the dynamic controller and an output coupled to the output terminal of the gate drive circuit.

3. The gate drive circuit of claim 2, wherein the buffer circuit and the dynamic controller are disposed on a single semiconductor substrate.

4. The gate drive circuit of claim 1, wherein the dynamic controller comprises a proportional-integral (PI) controller.

5. The gate drive circuit of claim 1, wherein:
    the gate drive feedback circuit has a first gain of a first polarity when the gate drive circuit turns-on the gate-controlled component; and
    the gate drive feedback circuit has a second gain of a second polarity when the gate driver circuit turns-off the gate-controlled component, wherein the first polarity and the second polarity are configured to provide negative feedback.

6. The gate drive circuit of claim 5, wherein the gate drive feedback circuit is further configured to rectify the feedback from the time derivative of the voltage at the output terminal of the gate drive circuit.

7. The gate drive circuit of claim 5, wherein:
    the gate drive feedback circuit is configured to limit a positive slew rate of the voltage at the output terminal of the gate drive circuit when the gate drive circuit turns-on the gate-controlled component; and
    the gate drive feedback circuit is configured to limit a negative slew rate of the voltage at the output terminal of the gate drive circuit when the gate drive circuit turns-off the gate-controlled component.

8. A circuit comprising:
    a gate driver circuit having an output coupled to a gate driving terminal, the gate driving terminal configured to be coupled to a gate of a switching transistor;
    a dynamic controller having an output coupled to an input of the gate driver circuit;
    a summing circuit having an output coupled to an input of the dynamic controller, and a first input configured to receive a reference signal;
    at least one feedback circuit coupled between a voltage measurement terminal and a second input of the summing circuit, the at least one feedback circuit configured to provide a signal proportional to at least one of a derivative of a load path voltage of the switching transistor and a derivative of a load path current of the switching transistor to the second input of the summing circuit; and
    an anti-windup circuit coupled between the output of the gate driver circuit and a third input of the summing circuit, the anti-windup circuit configured to provide a signal proportional to a derivative of an output voltage of the gate driver circuit to the third input of the summing circuit.

9. The circuit of claim 8, further comprising the switching transistor.

10. The circuit of claim 8, wherein the at least one feedback circuit comprises:
    a first feedback circuit configured to provide a first signal proportional to the derivative of the load path voltage to the second input of the summing circuit; and
    a second feedback circuit configured to provide a second signal proportional to the derivative of a load path current of the switching transistor to a fourth input of the summing circuit.

11. The circuit of claim 10, further comprising a clipping circuit coupled between an output of the second feedback circuit and the fourth input of the summing circuit.

12. The circuit of claim 8, wherein the anti-windup circuit is configured to:
    apply a first gain to the signal proportional to the derivative of the output voltage of the gate driver circuit when the gate driver circuit turns on the switching transistor; and
    apply a second gain to the signal proportional to the derivative of the output voltage of the gate driver circuit when the gate driver circuit turns off the switching transistor.

13. The circuit of claim 12, wherein the anti-windup circuit comprises:
    a first current mirror having an output coupled to the third input of the summing circuit; and
    a first capacitor coupled between the output of the gate driver circuit and an input of the first current mirror.

14. The circuit of claim 13, wherein the anti-windup circuit further comprises:
    a second current mirror having an output coupled to the third input of the summing circuit; and
    a second capacitor coupled between the output of the gate driver circuit and an input of the second current mirror.

15. The circuit of claim 14, wherein the first current mirror has a different mirror ratio from the second current mirror.

16. The circuit of claim 12, wherein the first gain comprises a first polarity, and the second gain comprises a second polarity opposite the first polarity, wherein the first polarity and the second polarity are configured to provide negative feedback.

17. The circuit of claim 8, further comprising an external booster stage having an input coupled to the gate driving terminal and an output configured to be coupled to the gate of the switching transistor.

18. A method of driving a switching transistor, the method comprising:
    driving the switching transistor with a gate drive signal;
    measuring at least one of a derivative of a load path voltage and a derivative of a load path current of the switching transistor;

measuring a derivative of the gate drive signal;

forming an error signal based on a reference signal, a measured derivative of the gate drive signal, and at least one of the measured derivative of the load path voltage of the switching transistor or the measured derivative of the load path current of the switching transistor; and forming the gate drive signal, wherein forming the gate drive signal comprises processing the error signal using a dynamic controller.

19. The method of claim 18, wherein forming the gate drive signal further comprises:

producing a control signal using the dynamic controller;

driving an input of a gate driving circuit with the control signal; and generating the gate drive signal using the gate driving circuit.

20. The method of claim 18, wherein driving the switching transistor with the gate drive signal comprises driving a booster stage with the gate drive signal, wherein an output of the booster stage is coupled to a gate of the switching transistor.

21. The method of claim 18, wherein the dynamic controller is a proportional-integral (PI) controller.

22. The method of claim 18, further comprising:

applying a first gain to the measured derivative of the gate drive signal prior to forming the error signal when turning on the switching transistor; and applying a second gain to the measured derivative of the gate drive signal prior to forming the error signal when turning off the switching transistor.

23. The method of claim 22, further comprising:

providing only a first polarity of the measured derivative of the gate drive signal prior to forming the error signal when turning on the switching transistor; and providing only a second polarity of the measured derivative of the gate drive signal prior to forming the error signal when turning off the switching transistor, wherein the second polarity is opposite the first polarity.

24. The method of claim 23, wherein:

the first polarity represents a positive slew rate of the gate drive signal; and the second polarity represents a negative slew rate of the gate drive signal.

25. The method of claim 22, wherein the first gain comprises a first polarity, and the second gain comprises a second polarity opposite the first polarity.

26. The method of claim 18, further comprising receiving a switch control signal, and generating the reference signal based on the received switch control signal.

27. The method of claim 26, wherein the switch control signal comprises a pulse-width modulated signal.

* * * * *